United States Patent
Miki

(10) Patent No.: US 8,330,255 B2
(45) Date of Patent: *Dec. 11, 2012

(54) SEMICONDUCTOR CHIP

(75) Inventor: Keiji Miki, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/137,380

(22) Filed: Aug. 10, 2011

(65) Prior Publication Data

US 2011/0298096 A1    Dec. 8, 2011

Related U.S. Application Data

(63) Continuation of application No. 11/873,436, filed on Oct. 17, 2007, now Pat. No. 8,022,508.

(30) Foreign Application Priority Data

Oct. 19, 2006 (JP) ................. 2006-284438
Sep. 7, 2007 (JP) ................. 2007-232114

(51) Int. Cl.
*H01L 23/544* (2006.01)

(52) U.S. Cl. ...................... 257/620; 257/758
(58) Field of Classification Search .......... 257/620, 257/730, 758, 797, E21.545
See application file for complete search history.

(56) References Cited

U.S. PATENT DOCUMENTS

| 6,743,647 B2 | 6/2004 | Hikosaka ............. 438/18 |
| 2003/0032263 A1 | 2/2003 | Nagao et al. |
| 2003/0071331 A1 | 4/2003 | Yamaguchi et al. |
| 2003/0153172 A1 | 8/2003 | Yajima et al. |
| 2005/0098893 A1* | 5/2005 | Tsutsue et al. ........ 257/758 |

FOREIGN PATENT DOCUMENTS

| JP | 11-297782 | 10/1999 |
| JP | 3398609 | 2/2003 |
| JP | 2003-124274 | 4/2003 |
| JP | 2003-124393 | 4/2003 |
| JP | 2005-340557 | 12/2005 |
| JP | 2006-5322 | 1/2006 |
| JP | 2006-156772 | 6/2006 |
| JP | 2006-203215 | 8/2006 |

* cited by examiner

*Primary Examiner* — Cuong Q Nguyen
(74) *Attorney, Agent, or Firm* — Panasonic Patent Center

(57) ABSTRACT

A semiconductor wafer 10 has a plurality of semiconductor chip areas 10a and a scribe area 10b, each of the semiconductor chip areas 10a having semiconductor elements and electrode pads (electrode portions) 16a electrically connected to the respective semiconductor elements, the scribe area 10b having monitor elements and electrode pads (electrode portions) 16b electrically connected to the monitor elements, wherein projecting electrodes 18 are selectively formed only on the respective electrode pads 16a in the semiconductor chip areas 10a by electroless plating. Thus, for example, the electrode pads 16b are covered with an insulating film 14.

10 Claims, 18 Drawing Sheets

SEMICONDUCTOR CHIP

CROSS-REFERENCE TO RELATED APPLICATIONS

This application is a continuation of application Ser. No. 11/873,436, filed Oct. 17, 2007, which application claims the priority of Japanese Patent Applications No. 2006-284438, filed Oct. 19, 2006 and No. 2007-232114, filed Sep. 7, 2007. The priority of each of the prior applications is claimed for this continuation application.

FIELD OF THE INVENTION

The present invention relates to a semiconductor wafer, a method of manufacturing the semiconductor wafer, and a method of manufacturing a semiconductor chip, and in particular, to a technique of forming electrode portions of a semiconductor wafer having a monitor element in a scribe area.

BACKGROUND OF THE INVENTION

With the reduced sizes and improved functions of information communication apparatuses and office electronic apparatuses, semiconductor devices (semiconductor integrated circuit devices: hereinafter referred to as semiconductor chips) mounted in these electronic apparatuses have been desired to have a smaller size as well as an increased number of external terminals for input and output.

Thus, with a conventional configuration in which a peripheral portion of the semiconductor chip is used as an area exclusively occupied by electrode portions (electrode pads) for connection to external circuits, it has been difficult to achieve both an increase in the number of external terminals and a size reduction. Thus, a technique called pad on element and a flip chip technique have more often been adopted; the pad on element forms electrode pads also on an active area, and the flip chip technique forms projecting electrodes called bumps on the electrode pads and connects the semiconductor chips to external circuits through the bumps.

On the other hand, significantly improved semiconductor manufacturing processes have contributed to further miniaturizing the structure of the semiconductor chip while further increasing integration degree. Copper wiring, having a relatively low resistance, has often been used as a wiring material. What is called a low-k material, having a small dielectric constant, has often been used as an interlayer insulating film.

Furthermore, the recently increased integration degree has led to complication of various semiconductor manufacturing processes. Whether or not semiconductor elements on each semiconductor chip normally operate depends on a variation in conditions for the manufacturing processes or the like. Thus, the properties of the semiconductor elements or various process values obtained during the semiconductor manufacturing process are inspected in a wafer state to estimate whether or not the semiconductor chip is acceptable and to determine whether or not the semiconductor manufacturing process normally operates.

For example, electrical property inspections are carried out to contact probes with electrode pads formed in each semiconductor chip area so as to be electrically connected to a plurality of semiconductor elements in the area. Furthermore, semiconductor elements (monitor elements) of a basic configuration and electrode pads electrically connected to the semiconductor element are arranged on a scribe area. The monitor elements are then inspected to estimate whether or not the properties of integrated circuit in the semiconductor chip area is acceptable. Even if the manufacturing process is abnormal, the abnormality is found early and fed back to minimize the occurrence probability of defective process articles.

However, a problem with miniaturized and highly integrated semiconductor chips is a shock that may result from wire bonding or inner lead bonding on the electrode pads or from contacting the probes with the electrode pads during electronic property inspections. Particularly when the electrode pads are formed on the active area or the low-k material is used as an interlayer insulating film, the shock often damages not only the electrode pads but also the interlayer insulating film, a wiring layer, and active elements, all of which are arranged under the electrode pads. This may degrade the electrical properties.

To avoid this, for example, Japanese Patent No. 3398609 proposes a technique of forming hard projecting electrodes of Ni-containing metal on the electrode pads so as to allow the projecting electrodes to act against the shock resulting from the wire bonding or inner lead bonding, thus inhibiting possible damage to the semiconductor elements.

Moreover, with the conventional method, when the flip chip scheme is used to connect the semiconductor chip to an external circuit, the bumps (projecting electrodes) on the electrode pads are pressure-welded and connected to the external circuit using an anisotropic conductive sheet (ACF). However, a method of forming bumps of solder and melting the bumps for connection has been proposed and gathering much attention because of the method's high possibility of being able to inhibit possible damage to the semiconductor elements.

However, the melting of the solder bumps for connection enables a reduction in damage during mounting but cannot avoid damage during the electrical property inspections. When the electrical property inspections are carried out on the electrode pads with no solder bumps formed thereon yet, the interlayer insulating film may be cracked or the electrical properties may be affected as described above. When the electrical property inspections are carried out after the formation of the solder bumps, the contact of the inspection probes may deform the solder bumps, affecting the mounting.

Thus, when the solder bumps are to be formed by a printing method or a ball mounting method, it is possible to form UBM (Under Bump Metal) of Ni or Au on the electrode pads before forming the solder bumps and to contact the inspection probe with the UBM for the electrical property inspections. This method enables electric connections to be ensured even with a load on the inspection probe set at a small value. This enables the inhibition of possible damage to the underlying structure of the electrode pads.

Methods of forming the projecting electrode are roughly classified into two types. One of the types utilizes electroplating. That is, a metal thin film is formed all over the surface of the wafer by sputtering or the like. An insulating film called plating resist is formed which has openings at positions where the projecting electrodes are to be provided. The plating resist is then grown into metal projections at the openings in the plating resist by electroplating. The metal projections are then used as a mask to etch away unwanted parts of the metal thin film to form projecting electrodes. However, this method uses the complicated manufacturing process, sharply increasing costs.

The other type is a method utilizing electroless plating. For example, an Al layer is formed all over the surface of the wafer at predetermined positions. An insulating film is then formed which has openings at predetermined electrode positions. The Al in a surface of the Al layer (this corresponds to the electrode pad) exposed from the openings is replaced with Zn by zincating. The wafer is subsequently immersed in an electroless plating solution to substitute Ni for Zn to form Ni projecting electrodes. An Au film is further formed on the surface of each of the Ni projecting electrodes. This method immerses the wafer in the electroless plating solution to selectively grow plating on the metal exposed portions, enabling the projecting electrodes to be formed. This eliminates the need for a photolithography process using a mask, allowing a reduction in manufacturing costs. This method is also used to form the projecting electrodes and UBM in Japanese Patent No. 3398609.

However, the formation of the projecting electrodes utilizing electroless plating also poses a problem. When the monitor elements and the electrode pads therefor are formed in the scribe area, the projecting electrodes are also formed on the electrode pads by electroless plating. Consequently, during a dicing step in which the semiconductor wafer is divided into individual semiconductor chips, significant chipping may occur or the wiring layer or interlayer insulting film under the projecting electrodes may be cracked. This may also affect the semiconductor chips.

The problem is more significant in highly miniaturized and integrated semiconductor wafers; the occurrence probability of chipping and cracking further increases. A semiconductor wafer of this kind uses the wiring layer mainly comprising Cu or the low-k material as an interlayer insulating film as described above. Thus, if not only the electrode pads but also the projecting electrodes are formed in the scribe area, the wafer is diced at the area in which the very hard projecting electrodes and the fragile low-k film are mixed. This is likely to increase the occurrence probability of chipping and to cause burrs at the electrode pads.

DISCLOSURE OF THE INVENTION

In view of these problems, an object of the present invention is to provide a semiconductor wafer having monitor elements in a scribe area and which is unlikely to undergo chipping or cracking during dicing even with projecting electrodes formed on electrode portions in a semiconductor chip area, and to obtain a semiconductor chip free from chipping or cracking, from the semiconductor wafer.

To accomplish this object, the present invention provides a semiconductor wafer including a plurality of semiconductor chip areas, each of the semiconductor chip areas having semiconductor elements and electrode portions electrically connected to the respective semiconductor elements, and a scribe area having monitor elements and electrode portions electrically connected to the monitor elements, wherein projecting electrodes are selectively formed only on the respective electrode portions in the semiconductor chip areas by electroless plating.

A first method of manufacturing the semiconductor wafer includes a first step of forming electrode portions including a metal layer at predetermined positions on the semiconductor chip areas and on the scribe area, a second step of using the electrode portions in the scribe area to inspect the monitor elements for electrical properties, and a third step of, after the first and second steps, selectively forming projecting electrodes only on the respective electrode portions in the semiconductor chip areas by electroless plating, wherein in the third step, before forming the projecting electrodes, an insulating film covering the electrode portions is formed only in the scribe area.

A second method includes a first step of forming electrode portions including a metal layer at predetermined positions on the semiconductor chip areas and on the scribe area, a second step of using the electrode portions in the scribe area to inspect the monitor elements for electrical properties, and a third step of, after the first and second steps, selectively forming projecting electrodes only on the respective electrode portions in the semiconductor chip areas by electroless plating, wherein in the first step, the metal layer formed in a surface layer is different between the electrode portions in the scribe area and the electrode portions in the semiconductor chip areas.

A third method includes a first step of forming electrode portions including a metal layer at predetermined positions on the semiconductor chip areas and on the scribe area, a second step of using the electrode portions in the scribe area to inspect the monitor elements for electrical properties, and a third step of, after the first and second steps, selectively forming projecting electrodes only on the respective electrode portions in the semiconductor chip areas by electroless plating, wherein the first step includes (a) a step of forming a Cu layer on the semiconductor chip areas and on the scribe area, (b) a step of forming a first insulating film having openings at predetermined positions on the Cu layer, (c) a step of forming an Al layer in each of the openings in the first insulating film, (d) a step of forming a second insulating film having openings on the Al layer, (e) a step of forming a lattice-like insulator only on the Al layer in the scribe area, and (f) a step of forming an Al layer on the Al layer on the semiconductor chip areas and the scribe area so that the Al layer also covers the lattice-like insulator, wherein the second step is carried out after the first step is ended, and in the third step, before the projecting electrodes are formed on the electrode portions in the semiconductor chip areas, the electrode portions in the semiconductor chip areas and in the scribe area are etched until the lattice-like insulator is protrusively exposed from the electrode portions in the scribe area.

In the semiconductor wafer, the projecting electrodes are selectively formed on the electrode portions in the semiconductor chip areas. This relaxes a possible shock during wire bonding or inner lead bonding for connection to an external circuit after the semiconductor wafer has been divided into individual semiconductor chips. This in turn prevents possible damage to the electrode portions and the underlying portions thereof. The monitor elements in the scribe area can be inspected for properties by the conventional method of contacting probes with the electrode portions. No projecting electrodes are formed on the electrode portions already used for property inspections, by electroless plating. This enables the inhibition of possible chipping or cracking during dicing.

Specifically, on the semiconductor wafer, the insulating film is formed in at least a part of each of the electrode portions in the scribe area or the metal layer different from that in the electrode portions in the semiconductor chip areas is formed in the surface layer of the electrode portions in the scribe area.

The semiconductor wafer has, for example, one of the following configurations. The insulating film is formed over the electrode portions in the scribe area. The Cu layer is provided at the predetermined electrode positions on the semiconductor chip areas and on the scribe area. The Al layer is provided on the Cu layer only in one of the semiconductor chip area and the scribe area.

Specifically, the Cu layer is provided at the predetermined electrode positions on the semiconductor chip areas and on the scribe area, and the Al layer is provided on the Cu layer only in the semiconductor chip areas. Alternatively, the Cu layer is provided at the predetermined electrode positions on the semiconductor chip areas and on the scribe area and the Al layer is provided on the Cu layer only in the scribe area.

The Cu layer is provided at the predetermined electrode positions on the semiconductor chip areas and on the scribe area. The Al layer is provided on the Cu layer. The lattice-like insulator is provided only on the Al layer on the scribe area. Small projections including Al are formed in the opening in the lattice-like insulator.

Each of the projecting electrodes includes Ni and has an Au film on a surface thereof. Some of the electrode portions in the semiconductor chip areas are positioned on active elements.

The second method of manufacturing the semiconductor wafer is, for example, as described below.

The first step includes (a) a step of forming a Cu layer at predetermined positions on the semiconductor chip areas and on the scribe area, (b) a step of forming an insulating film having openings at predetermined positions on the Cu layer, (c) a step of forming an Al layer in each of the openings in the insulating film, and (d) a step of further forming an Al layer on the Al layer only in one of the semiconductor chip area and the scribe area or removing the Al layer from only one of the semiconductor chip area and the scribe area to form the Al layer having a thickness varying between the semiconductor chip area and the scribe area, wherein the second step is carried out after one of the steps (c) and (d) in the first step, and in the third step, before the projecting electrodes are formed on the electrode portions in the semiconductor chip areas, the Al layer is partly removed so that the Cu layer is exposed from the electrode portions only in one of the semiconductor chip area and the scribe area.

The first step includes (a) a step of forming a Cu layer on the semiconductor chip areas and on the scribe area, (b) a step of forming a first insulating film having openings at predetermined positions on the Cu layer, (c) a step of forming an Al layer in each of the openings in the first insulating film, (d) a step of forming the second insulating film having openings on the Al layer, and (e) a step of selectively forming an Al layer only on the Al layer in the semiconductor chip areas, wherein the second step is carried out after the first step is ended, and in the third step, before the projecting electrodes are formed on the electrode portions in the semiconductor chip areas, the electrode portions in the semiconductor chip areas and in the scribe area are etched until the Al layer is removed from the electrode portions in the scribe area to expose the Cu layer.

The first step includes (a) a step of forming a Cu layer on the semiconductor chip area and on the scribe area, (b) a step of forming a first insulating film having openings at predetermined positions on the Cu layer, (c) a step of forming an Al layer in each of the openings in the first insulating film, and (d) a step of selectively half-etching only the Al layer in the scribe area, wherein the second step is carried out after the first step is ended, and in the third step, before the projecting electrodes are formed on the electrode portions in the semiconductor chip areas, the electrode portions in the semiconductor chip areas and in the scribe area are etched until the Al layer is removed from the electrode portions in the scribe area to expose the Cu layer.

The first step includes (a) a step of forming a Cu layer on the semiconductor chip areas and on the scribe area, (b) a step of forming a first insulating film having openings at predetermined positions on the Cu layer, (c) a step of forming an Al layer in each of the openings in the first insulating film, (d) a step of forming a second insulating film having openings on the Al layer, and (e) a step of selectively forming an Al layer only on the Al layer in the scribe area, wherein the second step is carried out after the first step is ended, and in the third step, before the projecting electrodes are formed on the electrode portions in the semiconductor chip areas, the electrode portions in the semiconductor chip areas and in the scribe area are etched until the Al layer is removed from the electrode portions in the semiconductor chip area to expose the Cu layer.

The first step includes (a) a step of forming a Cu layer on the semiconductor chip areas and on the scribe area, (b) a step of forming a first insulating film having openings at predetermined positions on the Cu layer, (c) a step of forming an Al layer in each of the openings in the first insulating film, and (d) a step of selectively half-etching only the Al layer in the scribe area, wherein the second step is carried out after the first step is ended, and in the third step, before the projecting electrodes are formed on the electrode portions in the semiconductor chip areas, the electrode portions in the semiconductor chip areas and in the scribe area are etched until the Al layer is removed from the electrode portions in the semiconductor chip area to expose the Cu layer.

In the third method of manufacturing the semiconductor wafer, the lattice-like insulator is advantageously formed simultaneously with formation of the second insulating film using the same material as that of the second insulating film. The lattice-like insulator is preferably formed so as to have a width greater than 2t when the thickness of the projecting electrode is defined as t.

In the third step, when the projecting electrodes are formed on the electrode portions in the semiconductor chip areas, if the surface layer in each of the electrode portions is the Al layer, the projecting electrode mainly including Ni and having the Au film on the surface thereof can be formed by carrying out a step of substituting Zn for the Al on the surface by zincating, a step of immersing the semiconductor wafer in an electroless Ni plating solution to cause a substitution reaction between Zn and Ni in the surface of each of the electrode portions to deposit Ni on the electrode portions, and a step of immersing the semiconductor wafer in an electroless Au plating solution to substitute Au for the Ni in the surface of the deposit.

In the third step, when the projecting electrodes are formed on the electrode portions in the semiconductor chip areas, if the surface layer in each of the electrode portions is the Cu layer, the projecting electrode mainly including Ni and having the Au film on the surface thereof can be formed by carrying out a step of sticking a Pd catalyst to the surface of the Cu layer and activating the Pd catalyst, a step of immersing the semiconductor wafer in the electroless Ni plating solution to deposit Ni on the surface of the electrode portions, and a step of immersing the semiconductor wafer in the electroless Au plating solution to substitute Au for the Ni in the surface of the deposit.

Advantageously, the electrode portions in the semiconductor chip areas and in the scribe area are etched within the step of forming the projecting electrodes.

The method may further include a step of contacting probes with the projecting electrodes in the semiconductor chip area to inspect the semiconductor elements for electrical properties.

A semiconductor chip can be manufactured by carrying out, on the semiconductor wafer having the plurality of semiconductor chip areas with the semiconductor elements formed therein and the scribe area with the monitor elements formed therein, a first step of providing the metal layer at predetermined positions on the semiconductor chip areas and on the scribe area and forming the electrode portions connected to the semiconductor elements and the electrode portions electrically connected to the monitor element, a second step of using the electrode portions in the scribe area to inspect the monitor elements for electrical properties, a third step of, after the first and second steps, selectively forming the projecting electrodes only on the electrode portions in the semiconductor chip areas by electroless plating, and a fourth step of, after the third step, dicing the semiconductor wafer at the scribe area to divide the semiconductor wafer into pieces corresponding to the semiconductor chip areas.

DESCRIPTION OF THE EMBODIMENTS

Embodiments of the present invention will be described with reference to the drawings.

Figure 1:
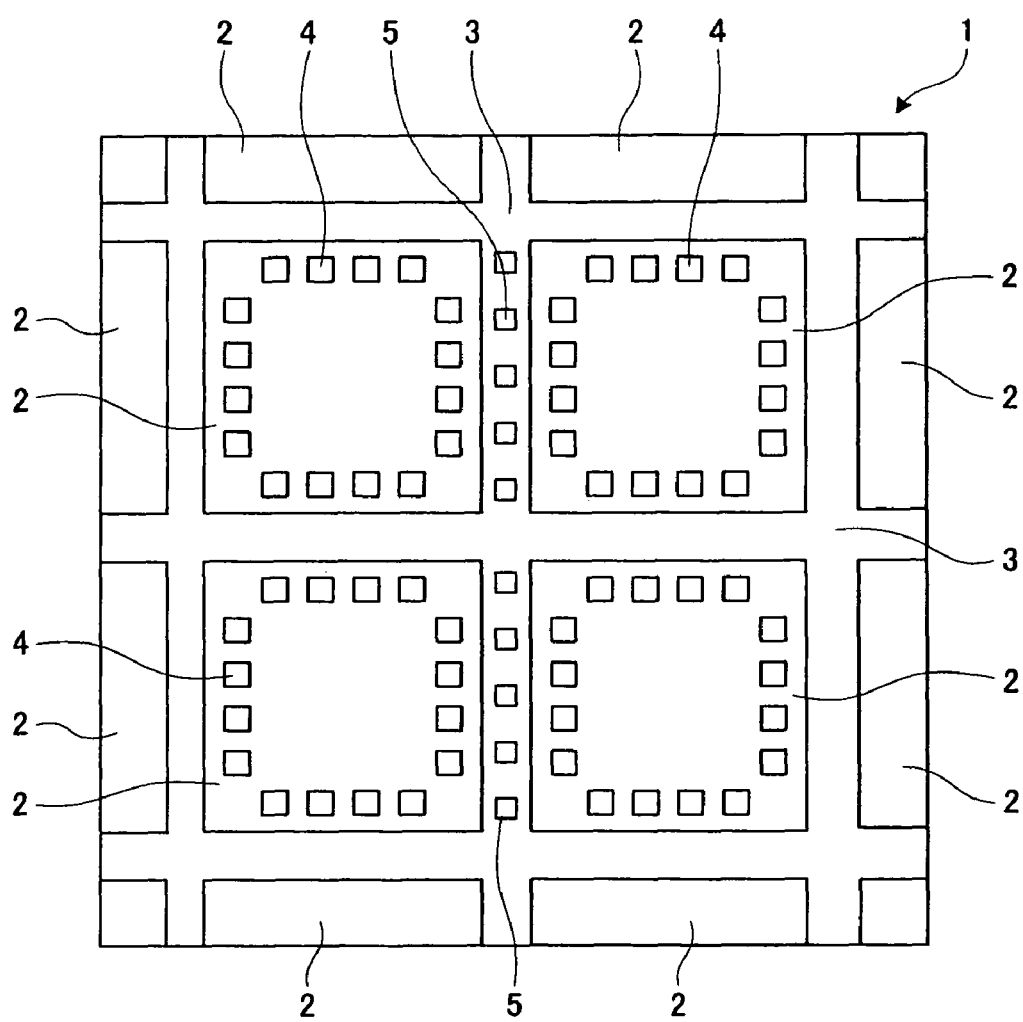
FIG. 1 is a schematic diagram of a part of a semiconductor wafer in accordance with the present invention.

FIG. 1 schematically shows a part of a semiconductor wafer in accordance with the present invention. A semiconductor wafer 1 has a plurality of semiconductor chip areas 2 and a scribe area 3. Each of the semiconductor chip areas 2 has a plurality of semiconductor elements (not shown) formed therein and a plurality of electrode portions 4 formed in a peripheral portion thereof and electrically connected to the respective semiconductor elements. In the semiconductor chip area 2, active elements are also present under the electrode portions 4. The scribe area 3 has monitor elements (not shown) for property inspections and a plurality of electrode portions 5 electrically connected to the monitor elements.

The scribe area 3 has the semiconductor elements (monitor elements) of a basic configuration such as transistors, resistors, or contact chains and the plurality of electrode portions 5 electrically connected to the monitor elements. Thus, during a manufacturing process or after a wafer process is ended, probes can be connected the electrode portions 5 to inspect the monitor elements of the basic configuration for electrical properties to estimate whether or not the integrated circuit in the semiconductor chip areas 2 which is an assembly of the above-described components has any problem with the property. Furthermore, even if a manufacturing process is abnormal, the abnormality can be found early and fed back to minimize the occurrence probability of defective process articles.

In the embodiments below, the electrode portions in the semiconductor chip area and in the scribe area are enlarged in the figures. Reference numerals different from those in FIG. 1 are used in the description.

Figure 2A:
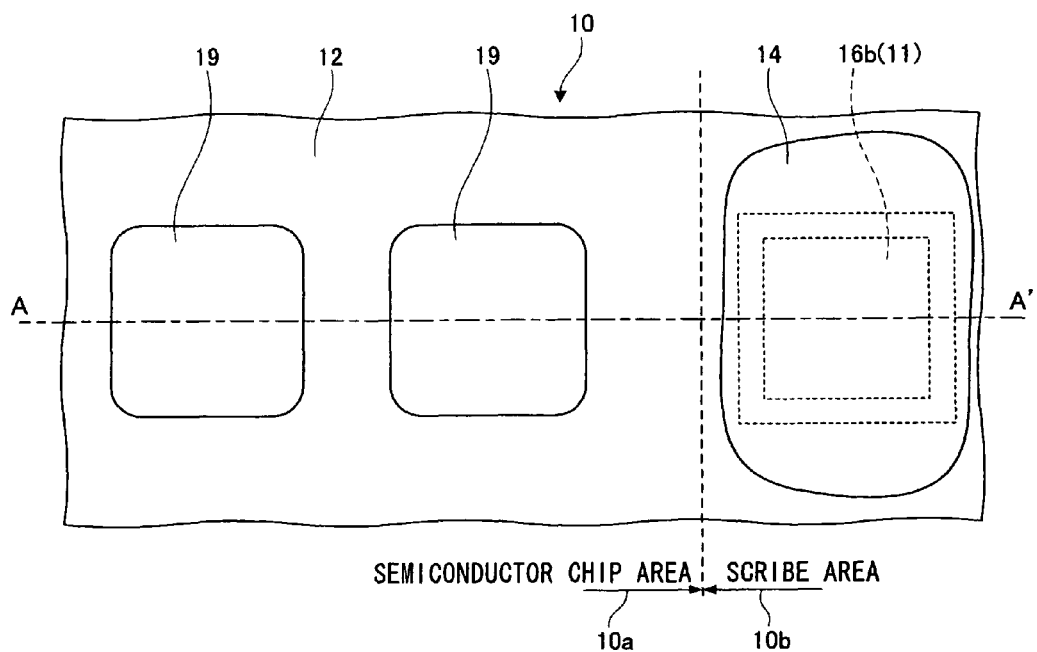
FIGS. 2A and 2B are enlarged diagrams showing a part of a semiconductor wafer in accordance with Embodiment 1 of the present invention.
Figure 2B:
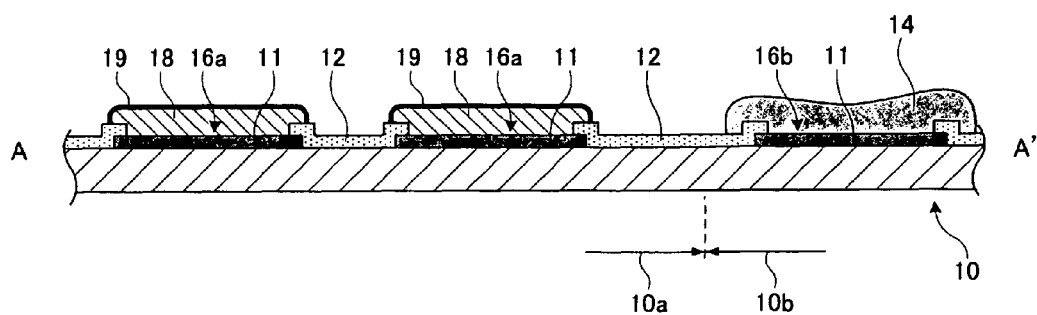

FIG. 2A is a plan view of a semiconductor wafer in accordance with Embodiment 1 of the present invention. FIG. 2B is a sectional view of the semiconductor wafer.

A metal layer 11 (hereinafter referred to as an Al layer 11) mainly comprising Al is formed on a semiconductor chip area 10a and a scribe area 10b of a semiconductor wafer 10. An insulating film 12 is formed which is made of silicon nitride and which has openings at predetermined positions on the Al layer 11. The Al layer 11 exposed from the openings in the insulating film 12 in the semiconductor chip area 10a corresponds to electrode pads 16a. The Al layer 11 exposed from the opening in the insulating film 12 in the scribe area 10b corresponds to an electrode pad 16b. The term "mainly comprising" means that the metal layer may be made of an alloy containing Al and a small amount of Cu and Si instead of pure Al. The metal layers described below have similar main components unless otherwise specified.

A projecting electrode 18 made of Ni and an Au film 19 are formed on each of the electrode pads 16a in the semiconductor chip area 10a. An insulating film 14 made of an epoxy resin is formed on the electrode pad 16b in the scribe area 10b.

With reference to FIGS. 3 and 4, description will be given of a method of manufacturing the semiconductor wafer shown in FIG. 2 and then semiconductor chips.

Figure 3A:
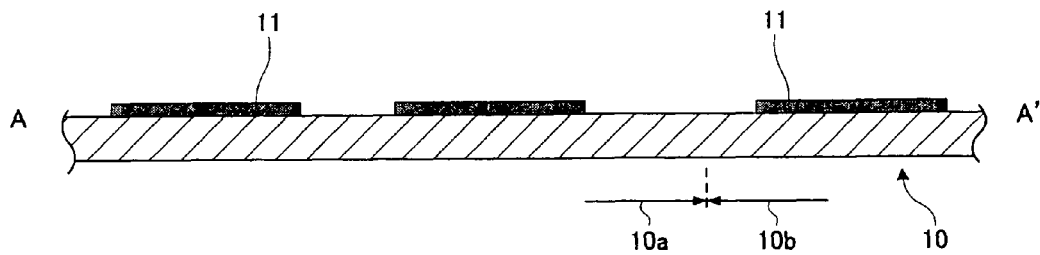
FIGS. 3A to 3D are sectional views showing the former steps of a method of manufacturing the semiconductor wafer in accordance with Embodiment 1 and dividing the semiconductor wafer into semiconductor chips.

As shown in FIG. 3A, the Al layer 11 is formed, in a predetermined pattern, on the semiconductor chip area 10a and scribe area 10b of the semiconductor wafer 10. The Al layer 11 is formed by forming a film all over the surface of the wafer by sputtering, patterning a resist, and dry etching the film through resist as a mask.

Figure 3B:
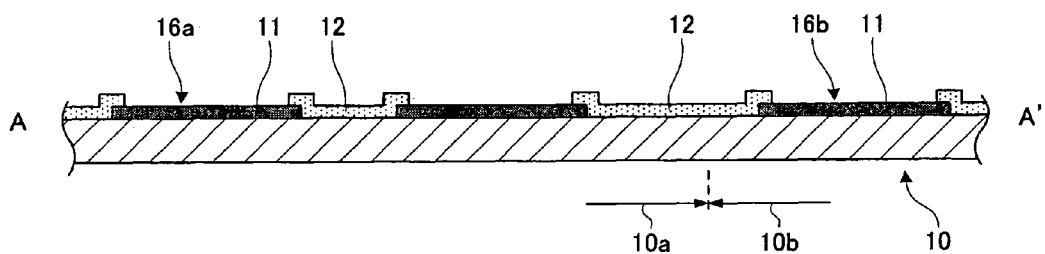

As shown in FIG. 3B, the insulating film 12 is formed which is made of silicon nitride and which has the openings at the predetermined positions on the Al layer 11. The insulating film 12 is formed by forming the film by CVD or the like, patterning a resist, and dry etching the film through the resist as a mask so that the film has the openings at the predetermined positions.

Figure 3C:
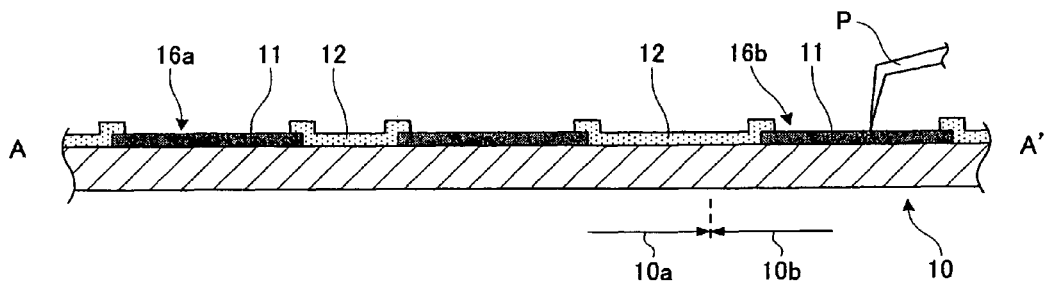

The electrodes pads 16a and 16b are thus formed in the semiconductor chip area 10a and in the scribe area 10b. A probe P is applied to the electrode pad 16b on the scribe area 10b to inspect the monitor elements for electrical properties as shown in FIG. 3C.

Figure 3D:
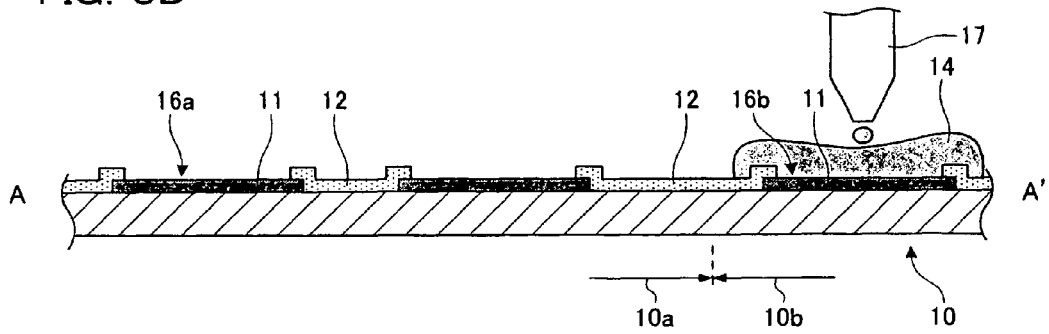

Subsequently, as shown in FIG. 3D, an aqueous epoxy resin is applied to the scribe area 10b so as to cover the electrode pad 16b and hardened to form the insulating film 14. Reference numeral 17 denotes a dispenser.

Figure 4A:
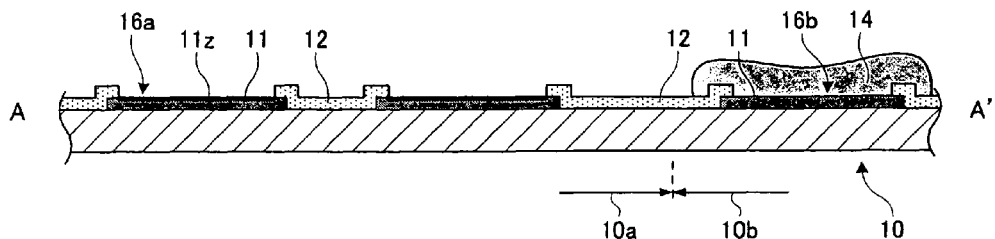
FIGS. 4A to 4E are sectional views showing the latter steps of the method of manufacturing the semiconductor wafer in accordance with Embodiment 1 and dividing the semiconductor wafer into semiconductor chips.
Figure 4B:
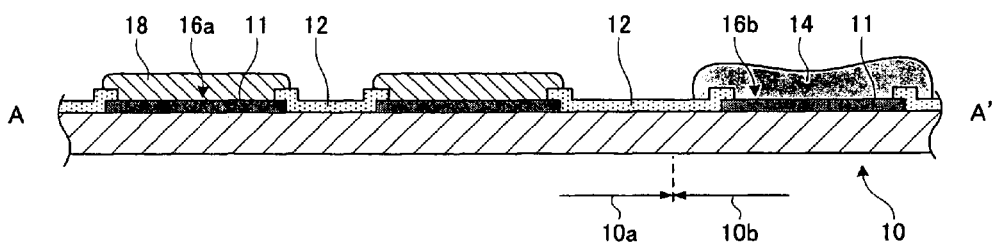
Figure 4C:
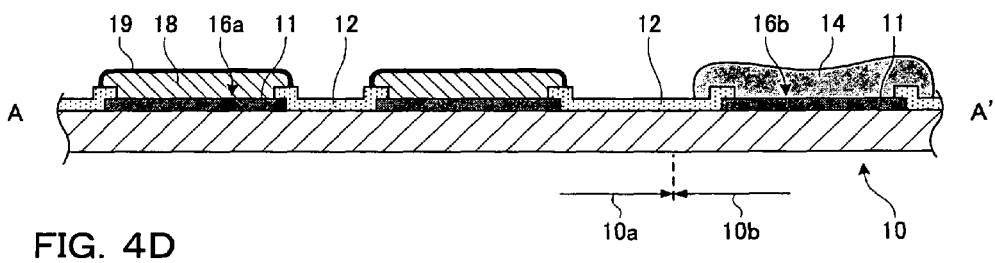

Then, as shown in FIG. 4A, the semiconductor wafer 10 is zincated to substitute Zn for the Al in the surface of the Al layer 11 constituting the electrode pad 16a. Reference numeral 11z in the figure denotes a Zn substitution portion. The semiconductor wafer 10 is then immersed in an electroless Ni plating solution to cause a substitution reaction between Zn and Ni in the surface of the electrode pads 16a. Thus, as shown in FIG. 4B, the projecting electrodes 18 made of Ni are formed on the Al layer 11. Since it is difficult to precipitate Ni directly on Al electrolessly, the zincating process typically is carried out. The semiconductor wafer 10 is immersed in an electroless Au plating solution to form the Au film 19 on the surface of each of the projecting electrodes 18 as shown in FIG. 4C.

Figure 4D:
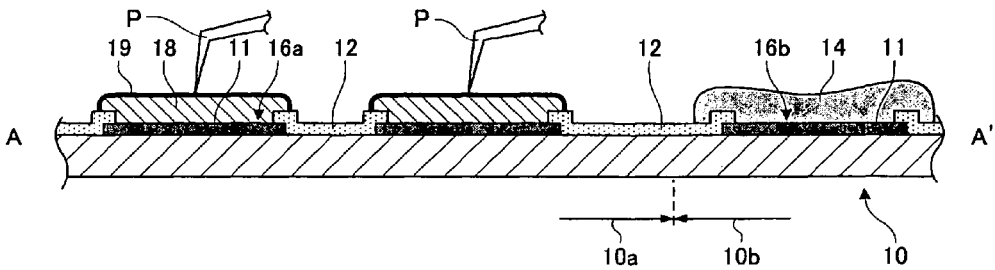

Subsequently, as shown in FIG. 4D, the probes P are applied to the Ni projecting electrodes 18 with the Au films 19 in the semiconductor chip area 10a to inspect the semiconductor elements for electrical properties. The electrical property inspections are carried out by the input and output of electric signals between an inspection machine and the semiconductor elements via a probe card (not shown) on which the probes P are arranged.

Figure 4E:
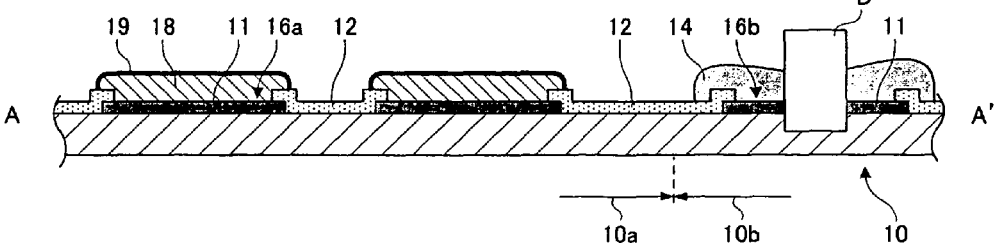

After the inspections are finished, the wafer is diced at the scribe area 10b using a dicing blade D to divide the wafer into semiconductor chips corresponding to the semiconductor chip areas 10a as shown in FIG. 4E.

As described above, the projecting electrodes 18 with the Au films 19 are formed only on the electrode pads 16a in the semiconductor chip area 10a of the semiconductor wafer 10 by electroless plating. Consequently, the individual semiconductor chips with the projecting electrodes 18 can be obtained. This also exerts the following effects.

(1) The projecting electrodes 18 are present on the electrode pads 16a used to connect to an external circuit. This relaxes a possible shock during wire bonding, inner lead bonding, or the like carried out to connect each semiconductor chip to the external circuit. This in turn makes it possible to inhibit possible damage to the electrode pads 16a as well as an interlayer insulating film, a wiring layer, and active elements all arranged under the electrode pads 16a. Thus, a variation in the properties of the active elements can be reduced.

(2) To inspect the semiconductor elements for electrical properties, the projecting electrodes 18 are probed. This enables a reduction in loads on the electrode pads 16a and the underlying structures, making it possible to inhibit possible damage to the electrode pads 16a, the interlayer insulating film, the wiring layer, and the active elements. Thus, a variation in the properties of the active elements can be reduced.

(3) The monitor elements in the scribe area 10b can be inspected for properties by contacting the probes P with the surface of the electrode pad 16b (Al layer 11), mainly comprising Al as in the prior art: No projecting electrode is formed, by electroless plating, on the electrode pad 16b already used for inspection. This makes it possible to inhibit possible chipping or cracking during dicing. Thus, appropriate semiconductor chips free from chipping or cracking are obtained.

The insulating film 14, covering the electrode pad 16b, is formed according to a dispense scheme without using a photolithography process. This makes it possible to minimize an increase in the number of steps required, allowing the inhibition of an increase in manufacturing costs.

The technique of forming the projecting electrodes 18 with the Au films 19 by electroless plating is common and easy. The technique is also expected to effectively inhibit possible damage attributed to the stack structure. However, the present invention is not limited to the stack structure provided that selective electroless plating can be carried out on Al. An Ni—P alloy may also be used for this purpose. This also applies to the description below unless otherwise specified.

Figure 5A:
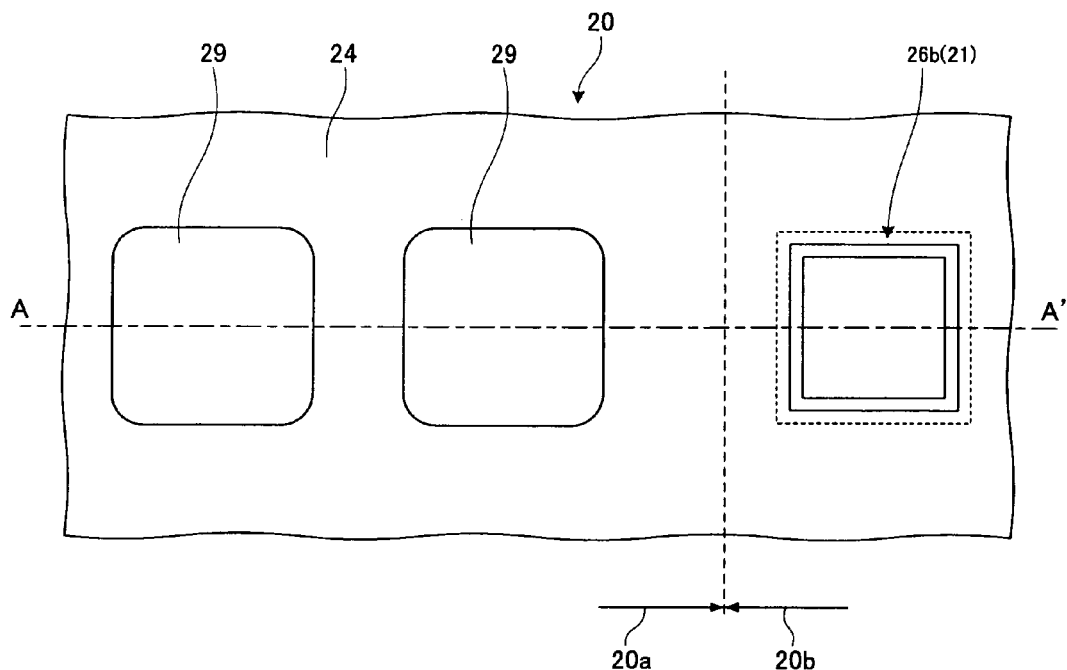
FIGS. 5A and 5B are an enlarged plan view and sectional view showing a part of a semiconductor wafer in accordance with Embodiment 2 of the present invention.
Figure 5B:
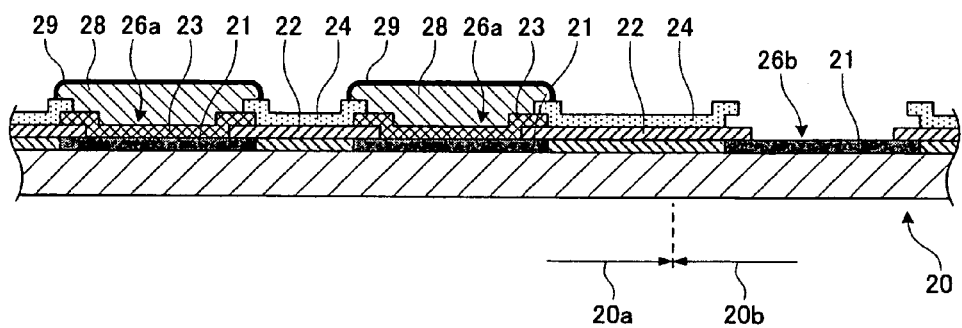

FIG. 5A is a plan view of a semiconductor wafer in accordance with Embodiment 2 of the present invention. FIG. 5B is a sectional view of the semiconductor wafer.

Electrode pads 26a each having a Cu layer 21 and an Al layer 23 stacked therein are formed on a semiconductor chip area 20a of the semiconductor wafer 20. A projecting electrode 28 made of Ni and an Au film 29 are formed on each of the electrode pads 26a. An electrode pad 26b made of the Cu layer 21 is formed on a scribe area 20b.

With reference to FIGS. 6 and 7, description will be given of a first method of manufacturing the semiconductor wafer shown in FIG. 5 and then semiconductor chips.

Figure 6A:
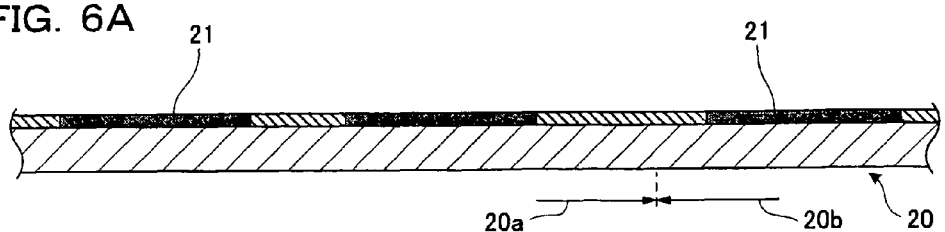
FIGS. 6A to 6F are sectional views showing the former steps of a first method of manufacturing the semiconductor wafer in accordance with Embodiment 2 and dividing the semiconductor wafer into semiconductor chips.
Figure 6B:
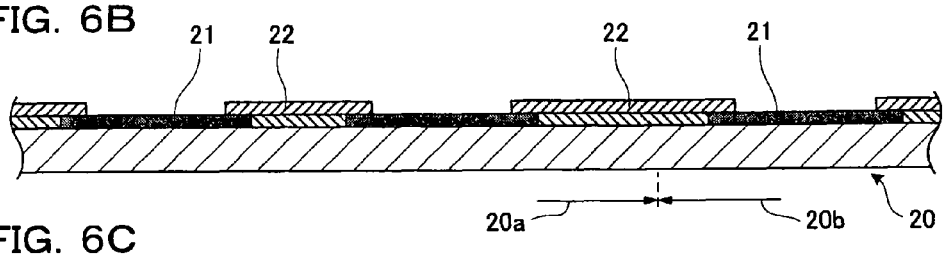
Figure 6C:
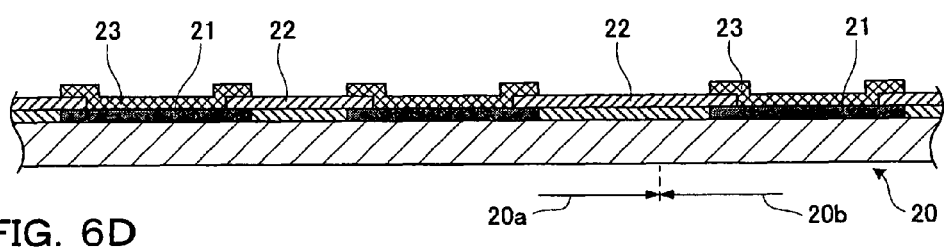

The Cu layer 21 is formed, in a predetermined pattern, on the semiconductor chip area 20a and scribe area 20b of the semiconductor wafer 20 (FIG. 6A). An insulating film 22 is formed which is made of silicon nitride and which has openings at predetermined positions on the Cu layer 21 (FIG. 6B). The Al layer 23 is formed in each of the openings in the insulating film 22 (FIG. 6C).

Figure 6D:
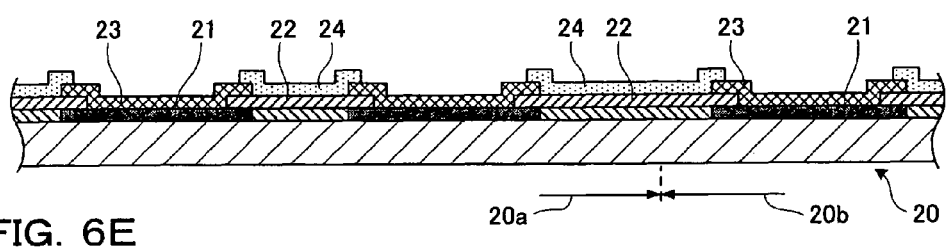
Figure 6E:
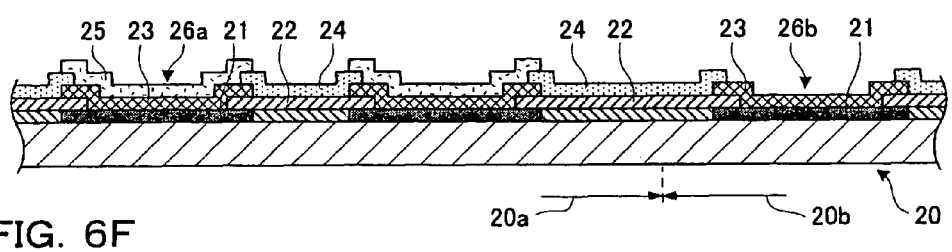

An insulating film 24 is then formed which has openings on the Al layer 23 (FIG. 6D). An Al layer 25 is selectively formed on the Al layer 23 in the semiconductor chip area 20a used for connection to the external circuit (FIG. 6E). The Cu layer 21, the Al layer 23, the Al layer 25, the insulating film 22, and the insulating film 24 are formed in the same manner as described above.

The electrode pads 26a each having the Cu layer 21, the Al layer 23, and the Al layer 25 stacked therein are thus formed on the semiconductor chip area 20a. The electrode pad 26b having the Cu layer 21 and the Al layer 23 stacked therein is formed in the scribe area 20b.

Figure 6F:
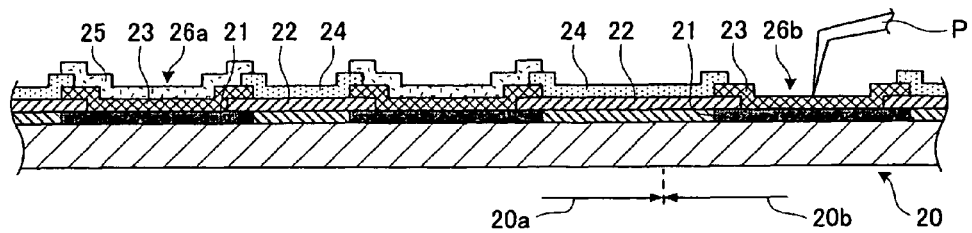

The probe P is applied to the electrode pad 26b on the scribe area 20b formed to inspect the monitor elements for electrical properties (FIG. 6F).

Figure 7A:
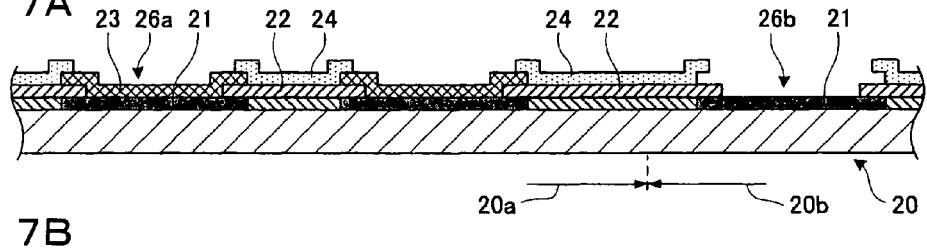
FIGS. 7A to 7F are sectional views showing the latter steps of the first method of manufacturing the semiconductor wafer in accordance with Embodiment 2 and dividing the semiconductor wafer into semiconductor chips.

The semiconductor wafer 20 is then subjected to an etching process using a water solution of phosphoric acid. The Al layer 23 in the electrode pad 26b in the scribe area 20b is thus melted and removed to expose the Cu layer 21. On the other hand, the Al layer 23 is exposed from each of the electrode pads 26a in the semiconductor chip area 20a (FIG. 7A).

Figure 7B:
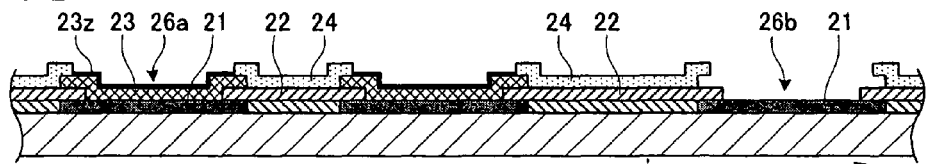
Figure 7C:
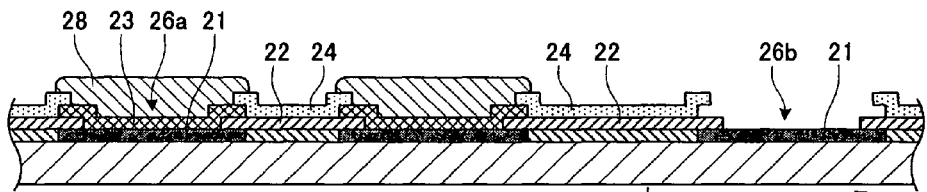
Figure 7D:
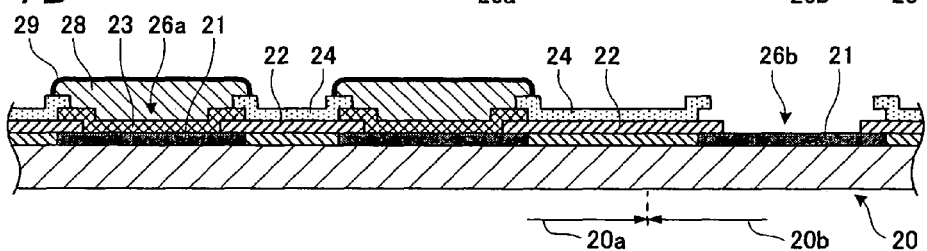

The semiconductor wafer 20 is zincated to substitute Zn for the Al in the surface of the Al layer 23 in each of the electrode pads 26a (FIG. 7B). Reference numeral 23z in the figure denotes a Zn substitution portion. The semiconductor wafer 20 is then immersed in an electroless Ni plating solution to cause a substitution reaction between Zn and Ni in the surface of the electrode pads 26a. Thus, the projecting electrodes 28 made of Ni are formed on the respective electrode pads 26a (FIG. 7C). Since it is difficult to precipitate Ni directly on Al electrolessly, the zincating process typically is carried out. The semiconductor wafer 20 is immersed in an electroless Au plating solution to form an Au film 29 on the surface of each of the projecting electrodes 28 (FIG. 7D).

Figure 7E:
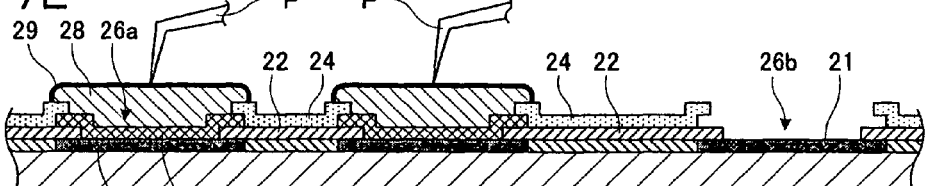
Figure 7F:
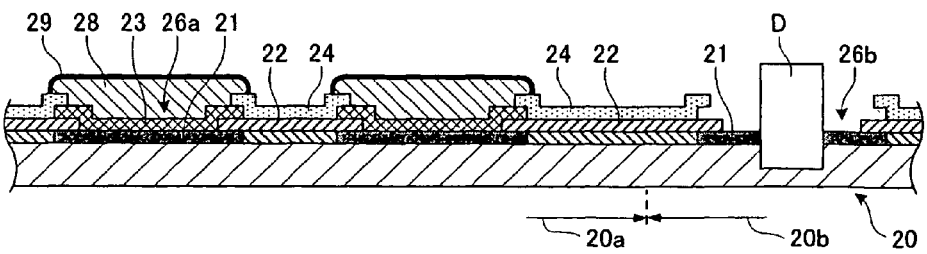

The probes P are subsequently applied to the projecting electrodes 28 with the Au films 29 in the semiconductor chip area 20a to inspect the semiconductor elements for electrical properties (FIG. 7E). After the inspections are finished, the wafer is diced at the scribe area 20b using the dicing blade D to divide the wafer into semiconductor chips corresponding to the semiconductor chip areas 20a (FIG. 7F).

Thus, the projecting electrodes 28 with the Au films 29 are selectively formed only on the electrode pads 26a in the semiconductor chip area 20a by electroless plating. Consequently, the individual semiconductor chips with the projecting electrodes 28 can be obtained.

Thus, the present embodiment can exert effects similar to the effects (1), (2), and (3) described for the semiconductor wafer shown in FIG. 2.

In the above description, the Al layer 25 is selectively formed on the Al layer 23 in the semiconductor chip area 20a used for connection to the external circuit. However, in actuality, alignment marks or the like used for alignment for dicing, substrate mounting, or the like may be provided in the metal exposed state. In this case, the Al layer 25 may be formed in the corresponding portion.

Phosphoric acid is used for etching in the step shown in FIG. 7A. However, the present invention is not limited to phosphoric acid and any substance may be used provided that the substance can etch Al. A water solution of sulfuric acid or sodium hydroxide may be used. This also applies to the description below unless otherwise specified.

With reference to FIGS. 8 and 9, description will be given of a second method of manufacturing the semiconductor wafer shown in FIG. 5 and then semiconductor chips.

Figure 8A:
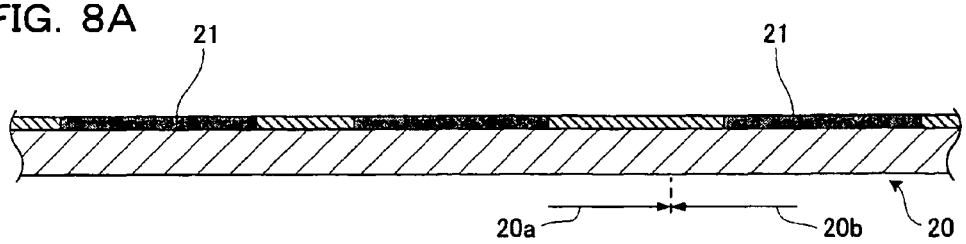
FIGS. 8A to 8E are sectional views showing the former steps of a second method of manufacturing the semiconductor wafer in accordance with Embodiment 2 and dividing the semiconductor wafer into semiconductor chips.
Figure 8B:
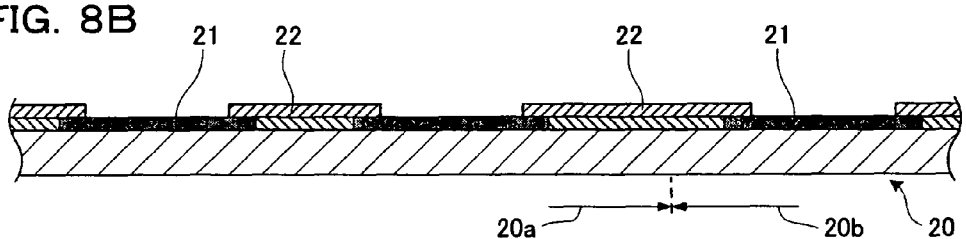
Figure 8C:
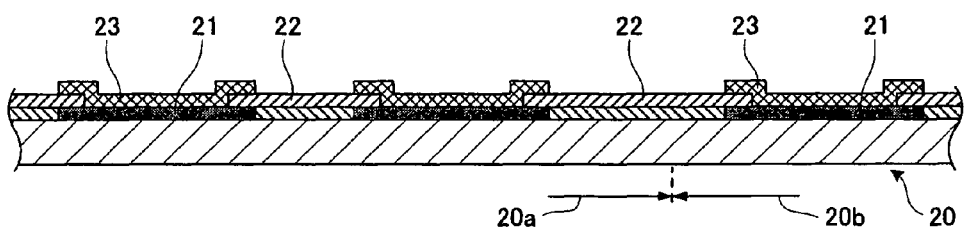

The Cu layer 21 and the Al layer 23 are formed at the predetermined positions in the semiconductor chip area 20a and scribe area 20b of the semiconductor wafer 20 as is the case with the first manufacturing method (FIGS. 8A to 8C).

Figure 8D:
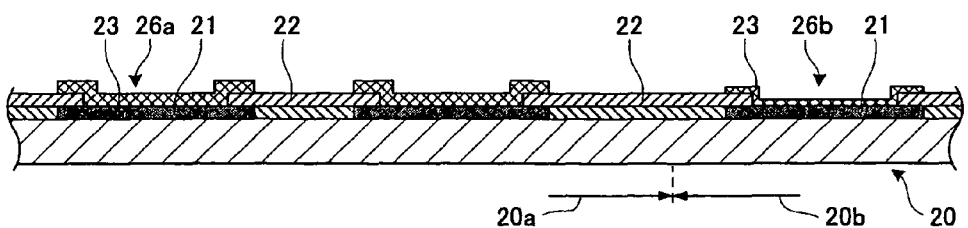

An etching resist (not shown) is then formed only on the semiconductor chip area 20a. In this state, only the Al layer 23 in the scribe area 20b is selectively half etched. After the half etching is finished, the etching resist is removed (FIG. 8D).

The electrode pads 26a each having the Cu layer 21 and the Al layer 23 stacked therein are thus formed on the semiconductor chip area 20a. The electrode pad 26b having the Cu layer 21 and the Al layer 23, which is thinner than the semiconductor chip area 20a, stacked therein is formed in the scribe area 20b.

Figure 8E:
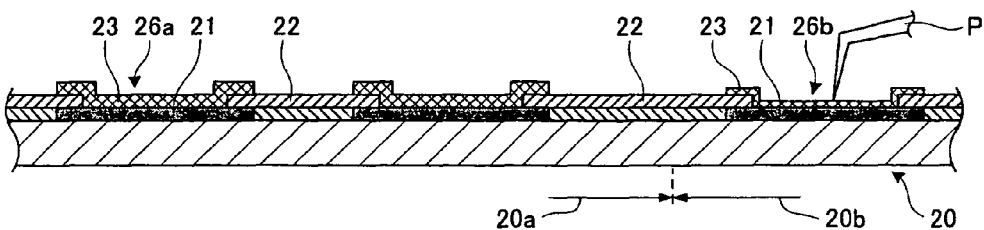

The probe P is applied to the electrode pad 26b on the scribe area 20b formed to inspect the monitor elements for electrical properties (FIG. 8E).

Figure 9A:
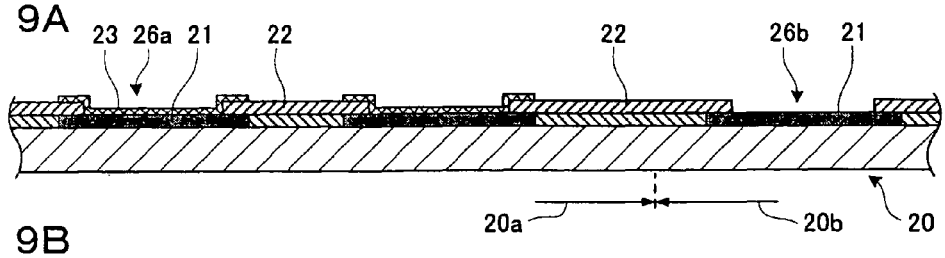
FIGS. 9A to 9F are sectional views showing the latter steps of the second method of manufacturing the semiconductor wafer in accordance with Embodiment 2 and dividing the semiconductor wafer into semiconductor chips.

The semiconductor wafer 20 is subsequently subjected to an etching process using a water solution of phosphoric acid. The etching process is carried out simultaneously with Al etching for purifying the metal surface during the electroless plating step. The Al layer 23 in the electrode pad 26b in the scribe area 20b is thus melted and removed to expose the Cu layer 21. On the other hand, the Al layer 23 in each of the electrode pads 26a in the semiconductor chip area 20a is thinned (FIG. 9A).

Figure 9B:
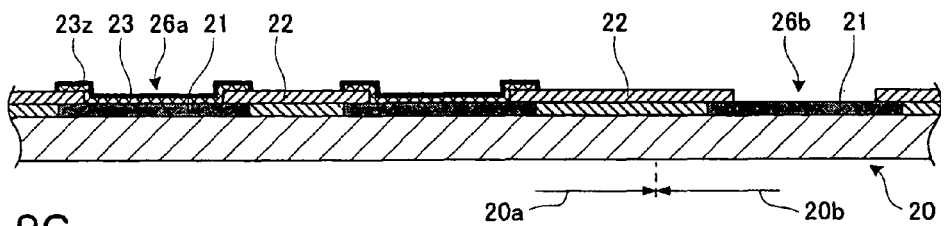
Figure 9C:
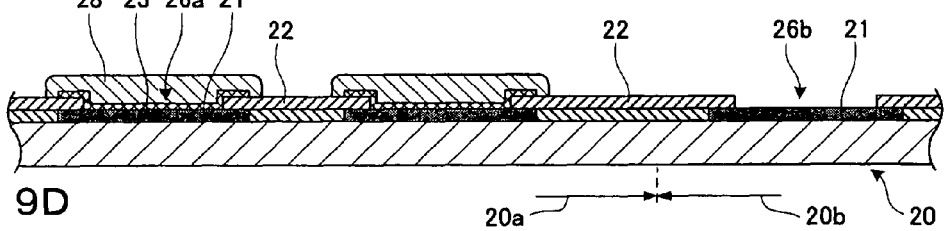
Figure 9D:
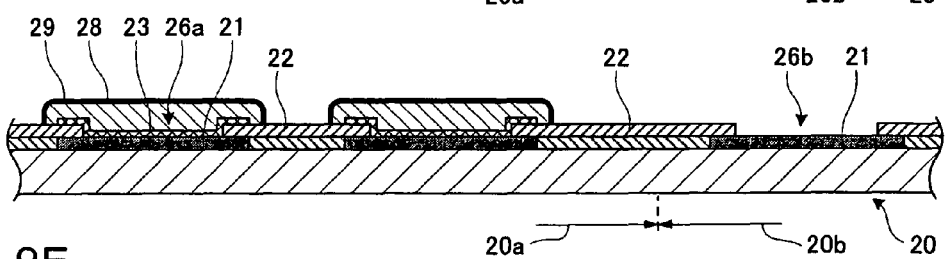

A Zn substitution portion 23z is then formed on the surface of the Al layer 23 in each of the electrode pads 26a. A substitution reaction between Zn and Ni is caused in the surfaces of the electrode pads 26a to form the projecting electrode 28 made of Ni, on the respective electrode pads 26a. The Au film 29 is formed on the surface of each of the projecting electrodes 28 (FIGS. 9B to 9D).

Figure 9E:
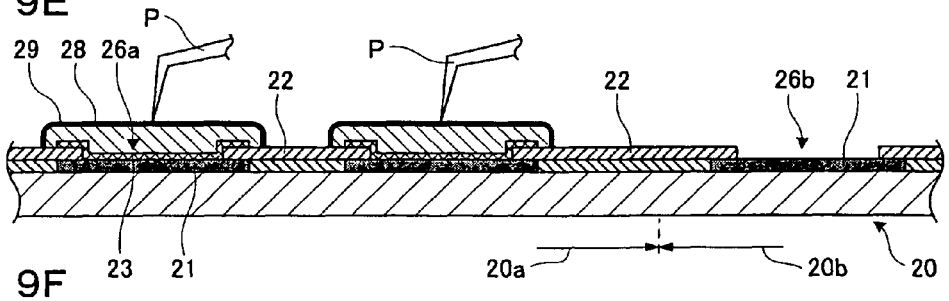
Figure 9F:
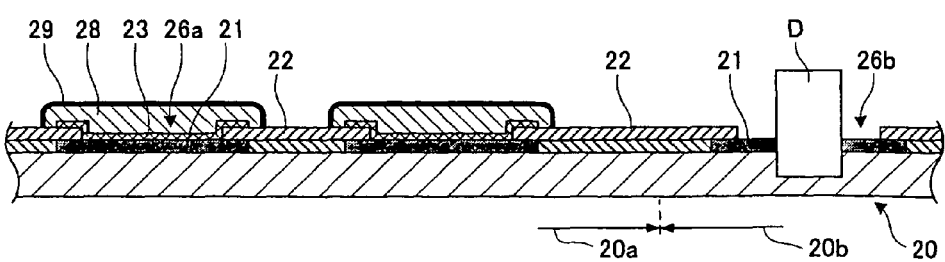

The probes P are subsequently applied to the projecting electrodes 28 with the Au films 29 in the semiconductor chip area 20a to inspect the semiconductor elements for electrical properties (FIG. 9E). After the inspections are finished, the wafer is diced at the scribe area 20b using the dicing blade D to divide the wafer into semiconductor chips corresponding to the semiconductor chip areas 20a (FIG. 9F).

Thus, the Ni projecting electrodes 28 with the Au films 29 are selectively formed only on the electrode pads 26a in the semiconductor chip area 20a by electroless plating. Consequently, the individual semiconductor chips with the projecting electrodes 28 can be obtained.

Thus, the second manufacturing method can also exert effects similar to the effects (1), (2), and (3) described for the semiconductor wafer shown in FIG. 2.

Moreover, the step of etching the electrode pad 26b to expose the Cu layer 21 as shown in FIG. 9A is carried out utilizing the etching step for purifying the metal surface in the electroless plating step. This makes it possible to minimize the number of steps required compared to the conventional method of manufacturing a semiconductor wafer, inhibiting an increase in manufacturing costs.

The etching step in the electroless plating step is commonly implemented so as to lightly etch the metal surface to be plated because the metal surface may be oxidized or contaminated regardless of whether the metal is Al or Cu. The light etching needs to be carried out immediately before the electroless plating process (as a preprocess for the electroless plating) and is required if an etching process has already been carried out. It is thus reasonable to simultaneously carry out the Al etching for purifying the metal surface (light etching) and the etching for varying the film thickness. Similar operations are desirably performed in the embodiments described below unless otherwise specified.

Figure 10A:
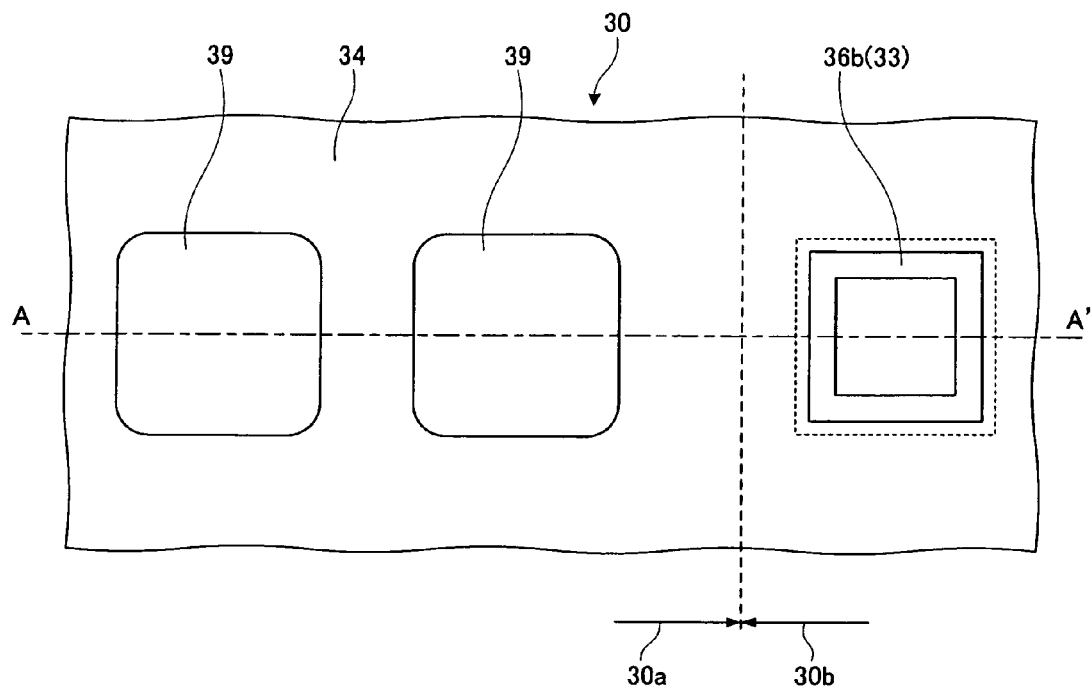
FIGS. 10A and 10B are an enlarged plan view and sectional view showing a part of a semiconductor wafer in accordance with Embodiment 3 of the present invention.
Figure 10B:
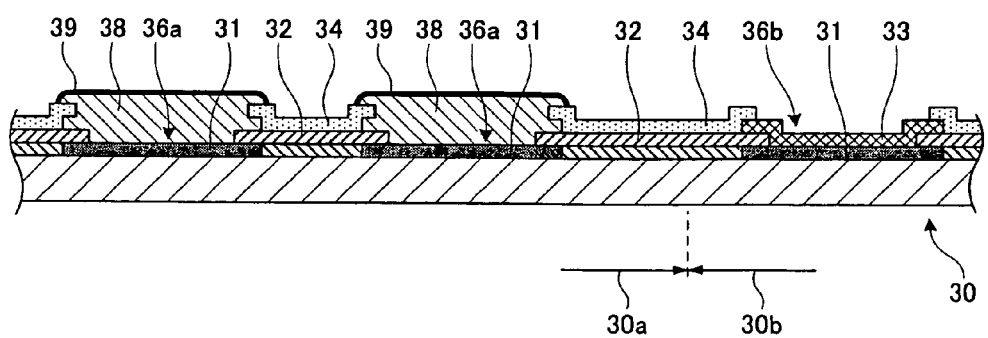

FIG. 10A is a plan view of a semiconductor wafer in accordance with Embodiment 3 of the present invention. FIG. 10B is a sectional view of the semiconductor wafer.

Electrode pads 36a each made of a Cu layer 31 is formed on a semiconductor chip area 30a of the semiconductor wafer 30. A projecting electrode 38 made of Ni and an Au film 39 are formed on each of the electrode pads 36a. An electrode pad 36b having the Cu layer 31 and an Al layer 33 stacked thereon is formed on a scribe area 30b.

With reference to FIGS. 11 and 12, description will be given of a first method of manufacturing the semiconductor wafer shown in FIG. 10 and then semiconductor chips.

Figure 11A:
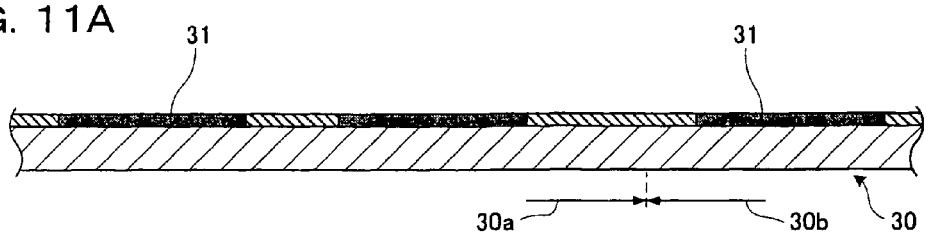
FIGS. 11A to 11F are sectional views showing the former steps of a first method of manufacturing the semiconductor wafer in accordance with Embodiment 3 and dividing the semiconductor wafer into semiconductor chips.
Figure 11B:
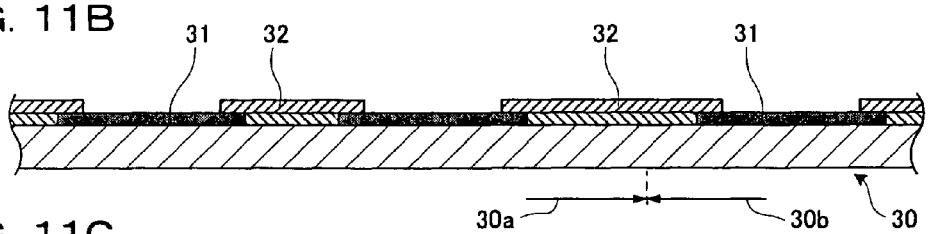
Figure 11C:
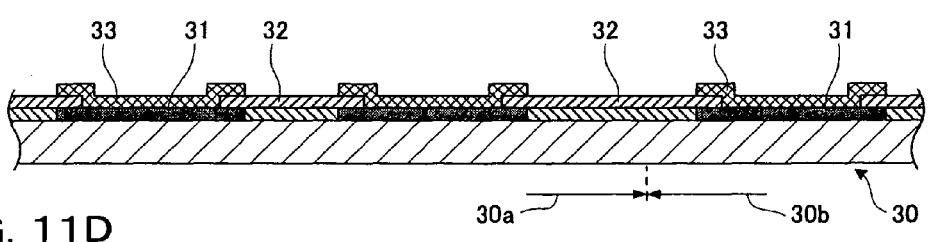
Figure 11D:
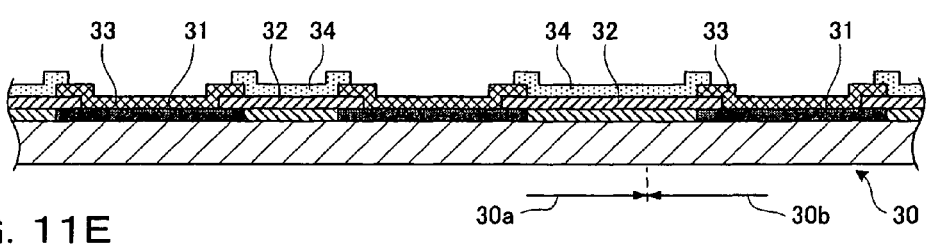
Figure 11E:
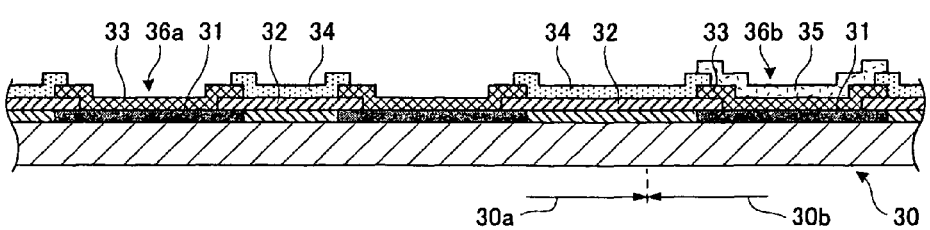

The Cu layer 31 is formed, in a predetermined pattern, on the semiconductor chip area 30a and scribe area 30b of the semiconductor wafer 30 (FIG. 11A). An insulating film 32 is formed which is made of silicon nitride and which has openings at predetermined positions on the Cu layer 31 (FIG. 11B). The Al layer 33 is formed in each of the openings in the insulating film 32 (FIG. 11C). An insulating film 34 is then formed which has openings on the Al layer 33 (FIG. 11D). An Al layer 35 is selectively formed only on the Al layer 33 in the scribe area 30*b* (FIG. 11E).

The electrode pads 36*a* each having the Cu layer 31, and the Al layer 33 stacked therein are thus formed on the semiconductor chip area 30*a*. The electrode pad 36*b* having the Cu layer 31, the Al layer 33, and the Al layer 35 stacked therein is formed in the semiconductor chip area 30*b*.

Figure 11F:
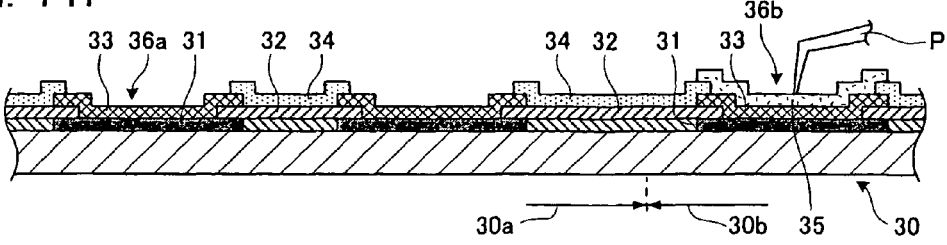

The probe P is applied to the electrode pad 36*b* on the scribe area 30*b* formed to inspect the monitor elements for electrical properties (FIG. 11F).

Figure 12A:
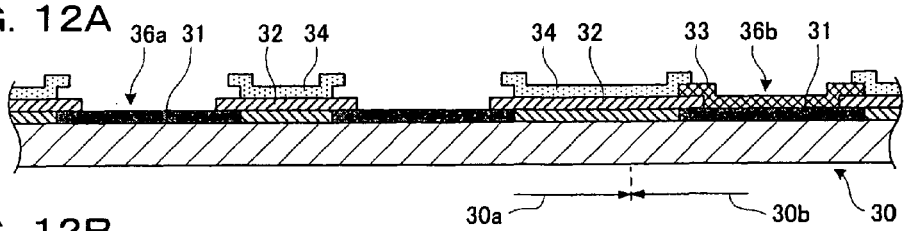
FIGS. 12A to 12F are sectional views showing the latter steps of the first method of manufacturing the semiconductor wafer in accordance with Embodiment 3 and dividing the semiconductor wafer into semiconductor chips.

The semiconductor wafer 30 is then subjected to an etching process using a water solution of phosphoric acid. The Al layer 33 in the electrode pads 36*a* in the semiconductor chip area 30*a* is thus melted and removed to expose the Cu layer 31. On the other hand, the Al layer 35 is melted and removed to expose the Al layer 33 in the electrode pad 36*b* in the scribe area 30*b* (FIG. 12A).

Figure 12B:
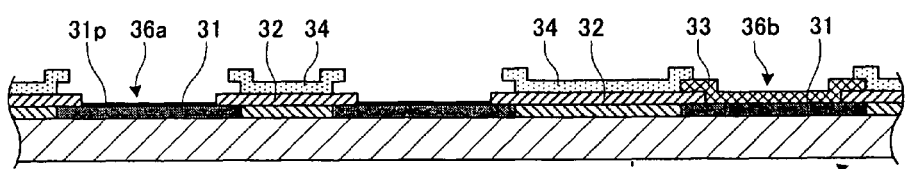

A catalyst applying process is carried on the semiconductor wafer 30 to stick Pd to the surface of each of the electrode pads 36*a* with the Cu layer 31 exposed therefrom (31*p* in the figure is a Pd sticking portion). An activating process of activating Pd is carried out so that the Pd can act as a catalyst for Ni plating; the activating process generally removes extra ions and the like bonded to the Pd to bring the Pd in a metal state (FIG. 12B).

Figure 12C:
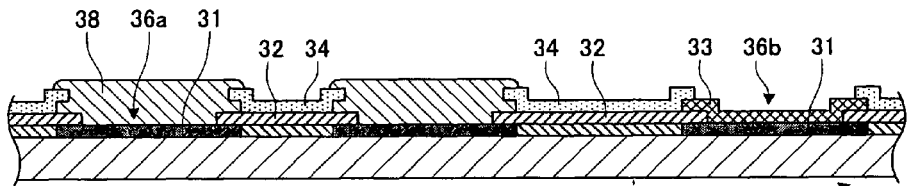
Figure 12D:
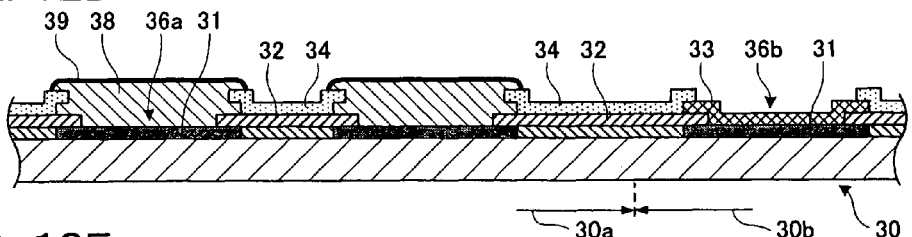

The semiconductor wafer 30 is immersed in an electroless Ni plating solution to deposit Ni on the surface of each of the electrode pads 36*a* in the semiconductor chip area 30*a* to form the projecting electrode 38 (FIG. 12C). Since it is difficult to precipitate the Ni directly on Cu electrolessly, a common method sticks palladium to the Cu surface and cause a plating reaction using the palladium as a catalyst. Then, the semiconductor wafer 30 is immersed in an electroless Au plating liquid to form the Au film 39 on the surface of each of the projecting electrodes 38 (FIG. 12D).

Figure 12E:
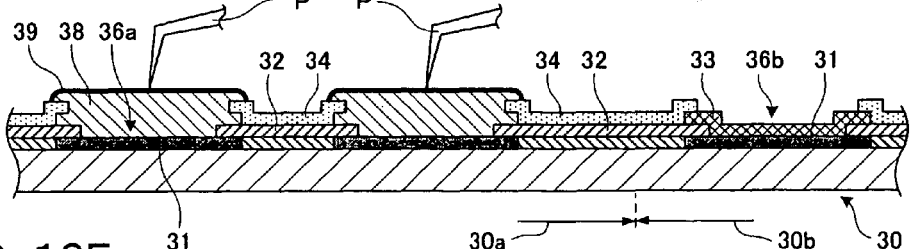
Figure 12F:
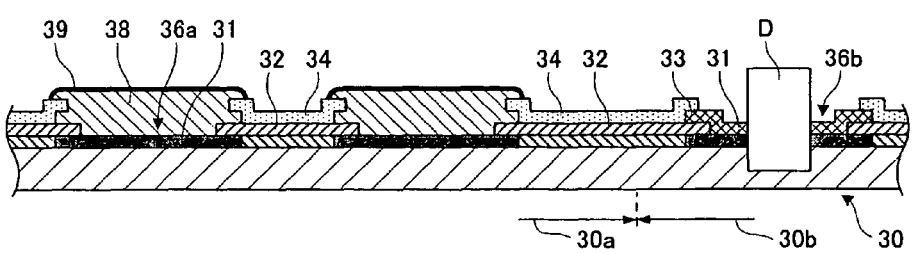

The probes P are subsequently applied to the projecting electrodes 38 with the Au films 39 in the semiconductor chip area 30*a* to inspect the semiconductor elements for electrical properties (FIG. 12E). After the inspections are finished, the wafer is diced at the scribe area 30*b* using the dicing blade D to divide the wafer into semiconductor chips corresponding to the semiconductor chip areas 30*a* (FIG. 12F).

Thus, the projecting electrodes 38 with the Au films 39 are selectively formed only on the electrode pads 36*a* in the semiconductor chip area 30*a* by electroless plating. Consequently, the individual semiconductor chips with the projecting electrodes 38 can be obtained.

Thus, the present method can exert effects similar to the effects (1), (2), and (3) described for the semiconductor wafer shown in FIG. 2.

With reference to FIGS. 13 and 14, description will be given of a second method of manufacturing the semiconductor wafer shown in FIG. 10 and then semiconductor chips.

The Cu layer 31 and the Al layer 33 are formed in the semiconductor chip area 30*a* and scribe area 30*b* of the semiconductor wafer 30 as is the case with the first manufacturing method described above (FIGS. 13A to 13C).

Figure 13A:
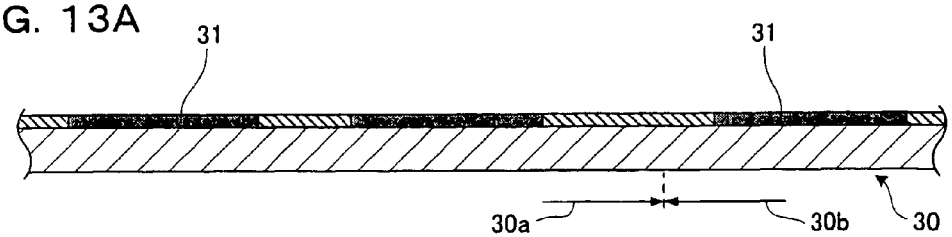
FIGS. 13A to 13E are sectional views showing the former steps of a second method of manufacturing the semiconductor wafer in accordance with Embodiment 3 and dividing the semiconductor wafer into semiconductor chips.
Figure 13B:
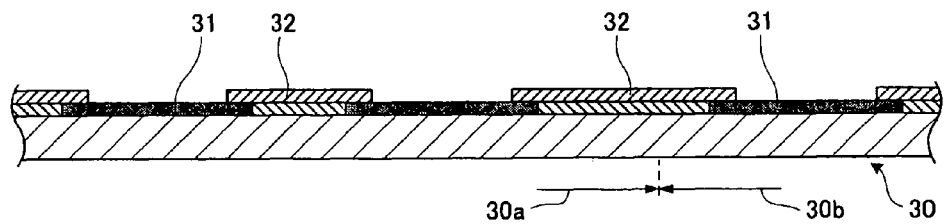
Figure 13C:
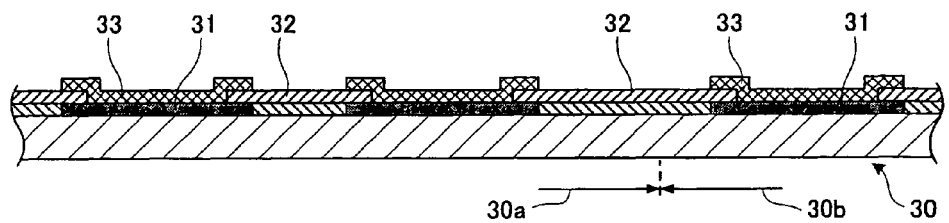
Figure 13D:
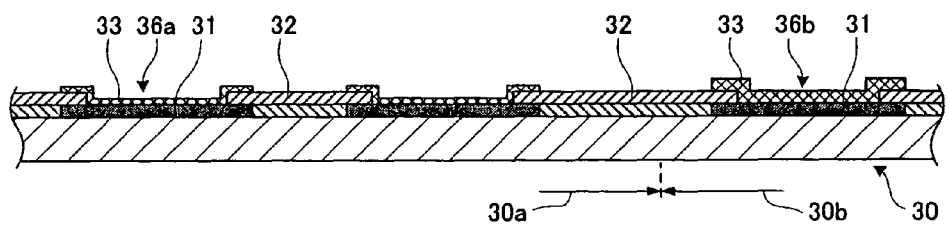

An etching resist (not shown) is then formed only on the scribe area 30*b*. In this state, only the Al layer 33 in the semiconductor chip area 30*a* is selectively half etched. After the half etching is finished, the etching resist is removed (FIG. 13D).

The electrode pads 36*a* each having the Cu layer 31 and the Al layer 33 stacked therein are thus formed on the semiconductor chip area 30*a*. The electrode pad 36*b* having the Cu layer 31 and the Al layer 33, which is thicker than the semiconductor chip area 30*a*, stacked therein is formed in the scribe area 30*b*.

Figure 13E:
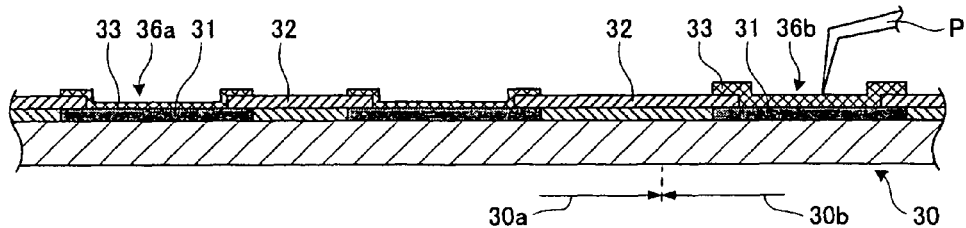

The probe P is applied to the electrode pad 36*b* on the scribe area 30*b* formed to inspect the monitor elements for electrical properties (FIG. 13E).

Figure 14A:
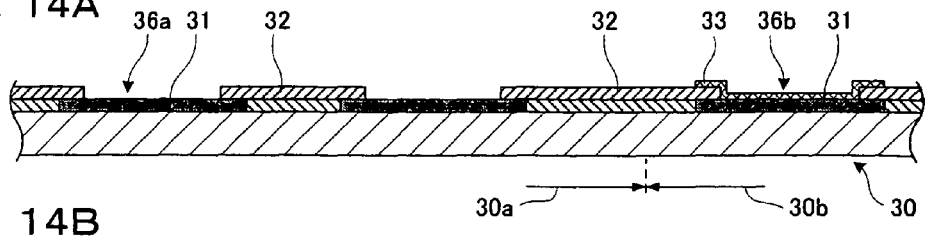
FIGS. 14A to 14F are sectional views showing the latter steps of the second method of manufacturing the semiconductor wafer in accordance with Embodiment 3 and dividing the semiconductor wafer into semiconductor chips.

The semiconductor wafer 30 is subsequently subjected to an etching process using a water solution of phosphoric acid. The etching process is carried out simultaneously with the Al etching for purifying the metal surface during the electroless plating step. The Al layer 33 in each of the electrode pads 36*a* in the semiconductor chip area 30*a* is thus melted and removed to expose the Cu layer 31. On the other hand, the Al layer 33 in the electrode pad 36*b* in the scribe area 30*b* is thinned (FIG. 14A).

Figure 14B:
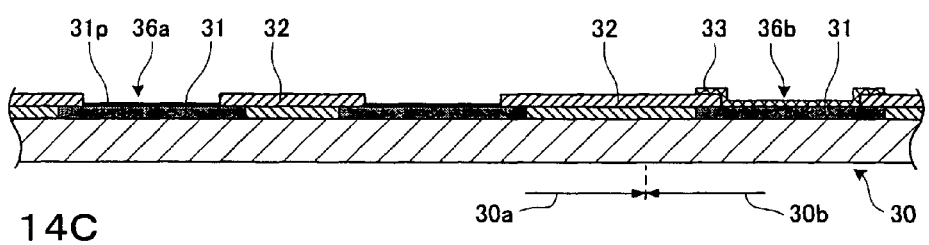
Figure 14C:
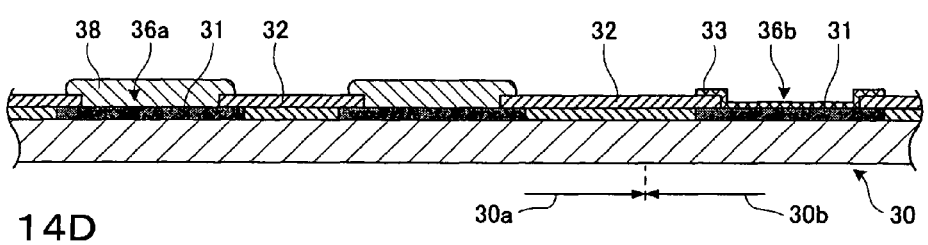
Figure 14D:
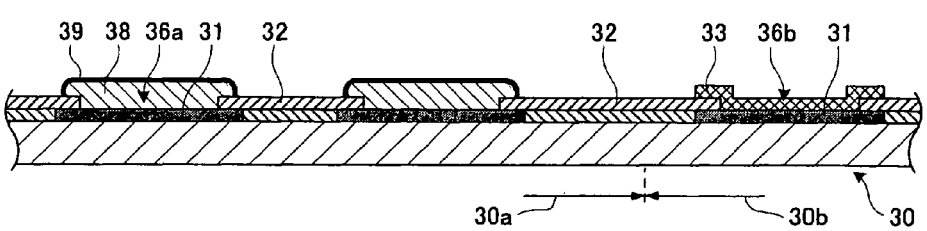

The subsequent steps are similar to those of the first method. That is, the catalyst applying process is carried on the semiconductor wafer 30 to stick Pd to the surface of each of the electrode pads 36*a* with the Cu layer 31 exposed therefrom (31*p* in the figure denotes the Pd sticking portion). The activating process is carried out to activate Pd so that the Pd can act as a catalyst for Ni plating (FIG. 14B). The semiconductor wafer 30 is then immersed in an electroless Ni plating solution to form the projecting electrode 38 made of Ni on the surface of each of the electrode pads 36*a* (FIG. 14C). Then, the semiconductor wafer 30 is immersed in an electroless Au plating solution to form the Au film 39 on the surface of each of the projecting electrodes 38 (FIG. 14D).

Figure 14E:
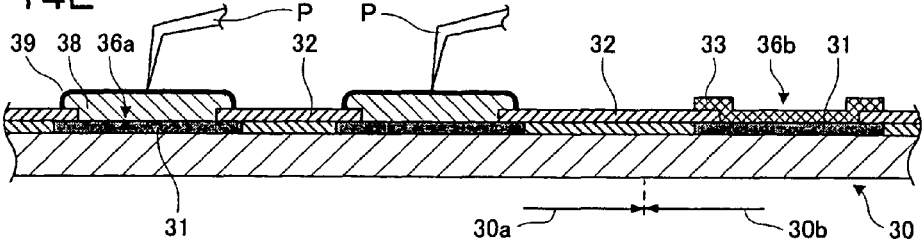
Figure 14F:
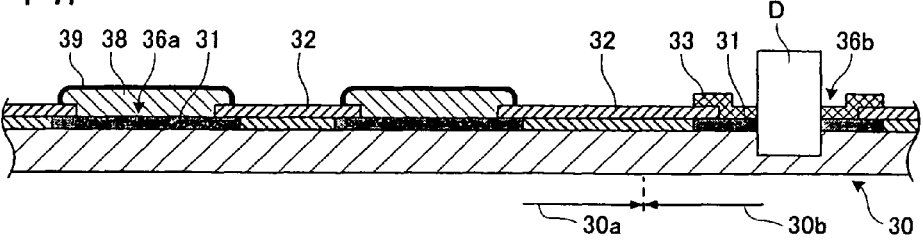

The probes P are subsequently applied to the projecting electrodes 38 with the Au films 39 in the semiconductor chip area 30*a* to inspect the semiconductor elements for electrical properties (FIG. 14E). After the inspections are finished, the wafer is diced at the scribe area 30*b* using the dicing blade D to divide the wafer into semiconductor chips corresponding to the semiconductor chip areas 30*a* (FIG. 14F).

Thus, the projecting electrodes 38 with the Au films 39 are selectively formed only on the electrode pads 36*a* in the semiconductor chip area 30*a* by electroless plating. Consequently, the individual semiconductor chips with the projecting electrodes 38 can be obtained.

Thus, the present method can exert effects similar to the effects (1), (2), and (3) described for the semiconductor wafer shown in FIG. 2.

Moreover, the step of etching each of the electrode pads 36*a* in the semiconductor chip area 30*a* to expose the Cu layer 31 is carried out utilizing the step of etching (purifying) the Al surface in the electroless plating step. This makes it possible to minimize the number of steps required compared to the conventional method of manufacturing a semiconductor wafer, inhibiting an increase in manufacturing costs.

Figure 15A:
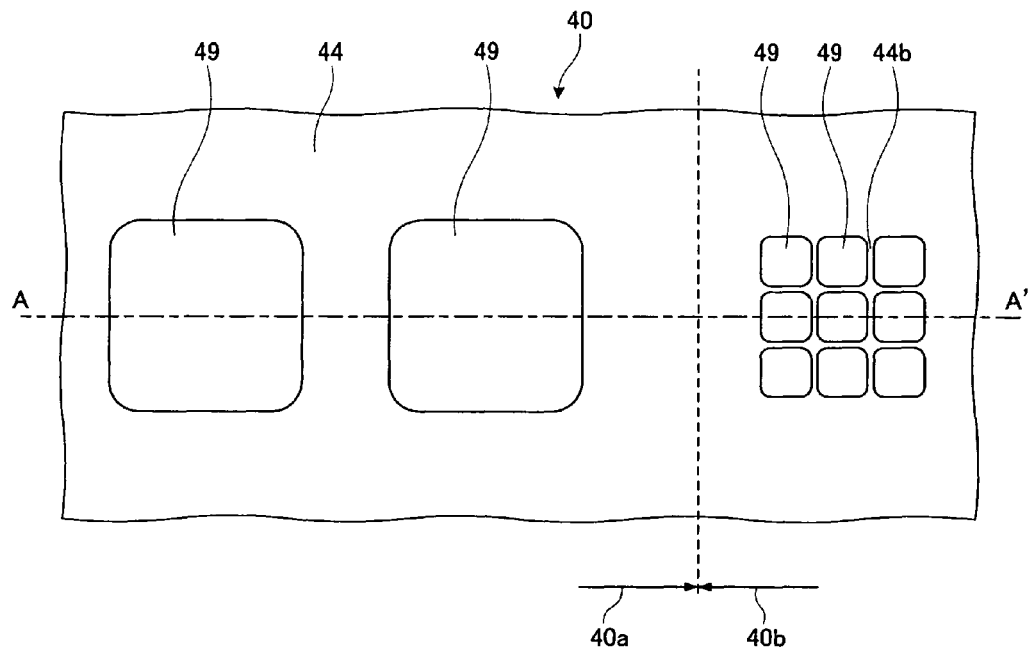
FIGS. 15A and 15B are an enlarged plan view and a sectional view showing a part of a semiconductor wafer in accordance with Embodiment 4 of the present invention.
Figure 15B:
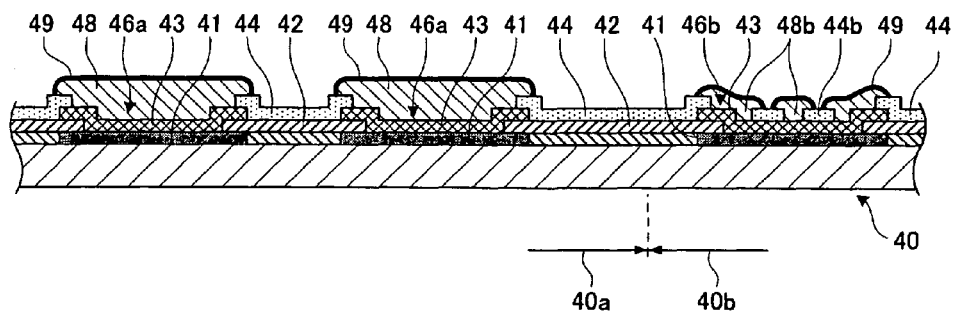

FIG. 15A is a plan view of a semiconductor wafer in accordance with Embodiment 4 of the present invention. FIG. 15B is a sectional view of the semiconductor wafer.

Electrode pads 46*a* each having a Cu layer 41 and an Al layer 43 stacked therein are formed on a semiconductor chip area 40*a* of the semiconductor wafer 40. A projecting electrode 48 made of Ni and an Au film 49 are formed on each of the electrode pads 46*a*. The Cu layer 41 and an Al layer 43 are formed on a scribe area 40*b*. A lattice-like insulating film 44*b* is formed on the Al layer 43. Very small projections 48*b* made of Ni and an Au film 49 are formed all over the top surface of the scribe area 40*b* except for the surface of the lattice-like insulating film 44*b*.

With reference to FIGS. 16 and 17, description will be given of a method of manufacturing the semiconductor wafer shown in FIG. 15 and then semiconductor chips.

Figure 16A:
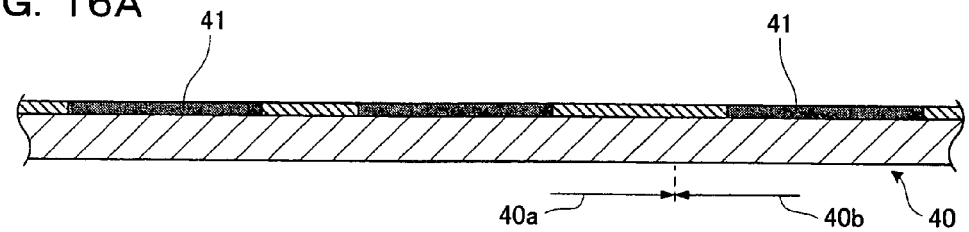
FIGS. 16A to 16F are sectional views showing the former steps of a method of manufacturing the semiconductor wafer in accordance with Embodiment 4 and dividing the semiconductor wafer into semiconductor chips.
Figure 16B:
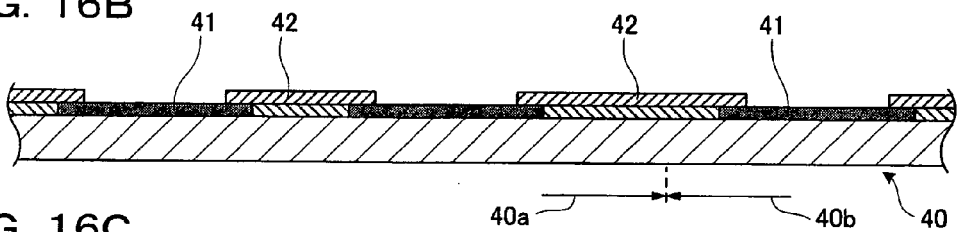
Figure 16C:
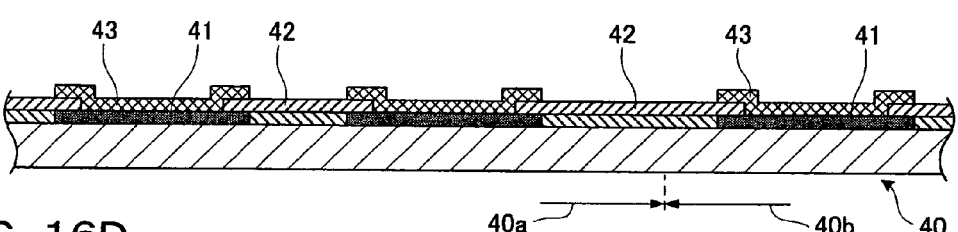

The Cu layer 41 is formed, in a predetermined pattern, on the semiconductor chip area 40a and scribe area 40b of the semiconductor wafer 40 (FIG. 16A). An insulating film 42 is formed which is made of silicon nitride and which has openings at predetermined positions on the Cu layer 41 (FIG. 16B). The Al layer 43 is formed in each of the openings in the insulating film 42 (FIG. 16C).

Figure 16D:
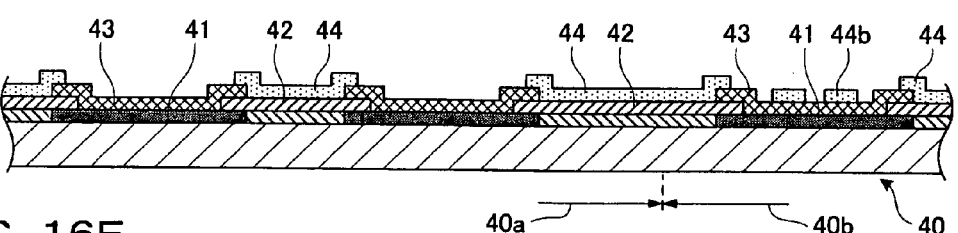
Figure 16E:
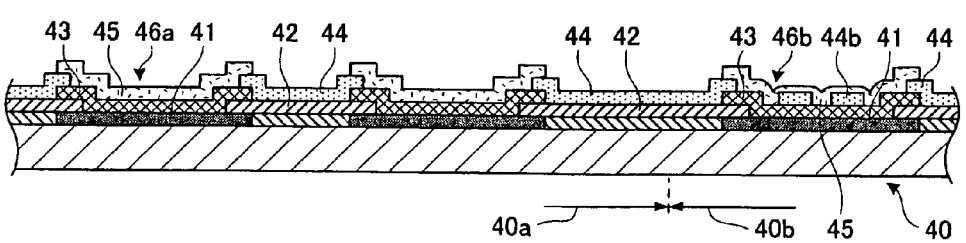

An insulating film 44 is then formed which has openings on the Al layer 43. At the same time, the lattice-like insulating film 44b is formed on the Al layer 43 in the scribe area 40b; the lattice-like insulating film 44b partitions the area inside the opening (FIG. 16D). An Al layer 45 is subsequently formed in the opening in the insulating film 44 (FIG. 16E).

The electrode pads 46a each having the Cu layer 41, the Al layer 43, and the Al layer 45 stacked therein are thus formed on the semiconductor chip area 40a. The electrode pad 46b having the Cu layer 41, the Al layer 43, and the Al layer 45 stacked therein is formed in the scribe area 40b, with the lattice-like insulating film 44b located under the Al layer 45.

Figure 16F:
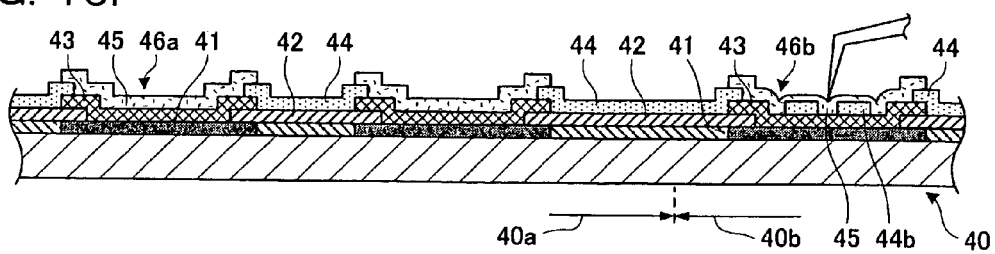

The probe P is applied to the electrode pad 46b on the scribe area 40b formed to inspect the monitor elements for electrical properties (FIG. 16F).

Figure 17A:
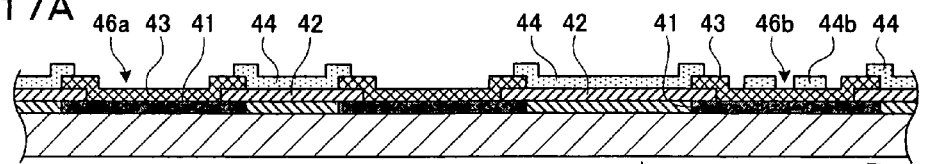
FIGS. 17A to 17F are sectional views showing the latter steps of the method of manufacturing the semiconductor wafer in accordance with Embodiment 4 and dividing the semiconductor wafer into semiconductor chips.

The electrode pads 46a and 46b are subsequently etched using a water solution of phosphoric acid. The Al layer 45 is thus removed to expose the Al layer 43 from each of the electrode pads 46a in the semiconductor chip area 40a, while exposing the lattice-like insulating film 44b and the Al layer 43 partitioned by the insulating film 44b, from the electrode pad 46b in the scribe area 40b (FIG. 17A).

Figure 17B:
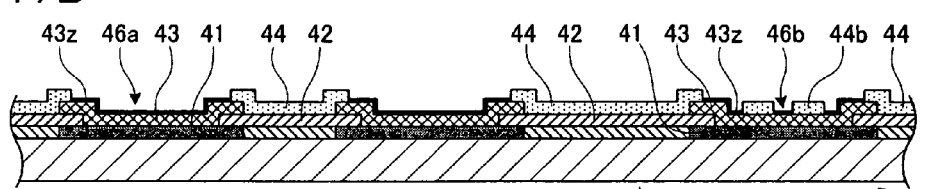

The semiconductor wafer 40 is then zincated to substitute Zn for the Al in the surface of the Al layer 43 in each of the electrode pads 46a and 46b. Reference numeral 43z in the figure denotes a Zn substitution portion (FIG. 17B).

Figure 17C:
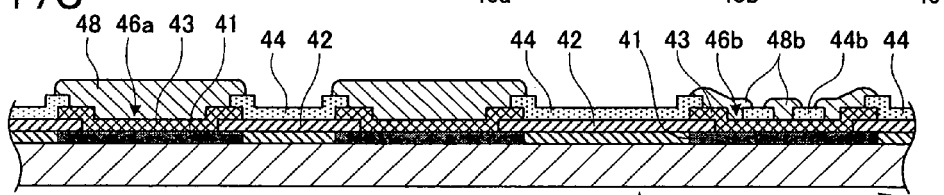
Figure 17D:
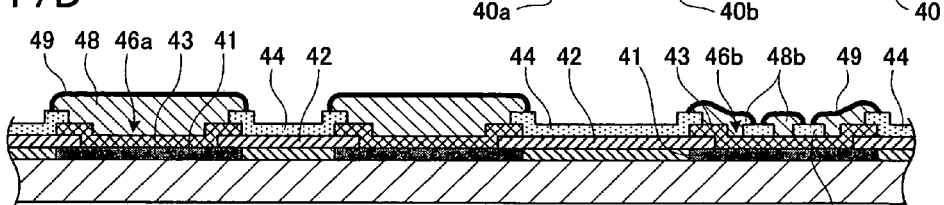

The semiconductor wafer 40 is then immersed in an electroless Ni plating solution. This results in a substitution reaction between Zn and Ni in the surface of the electrode pads 46a and 46b to form the projecting electrodes 48 made of Ni, on the respective electrode pads 46a on the semiconductor chip area 40a. At the same time, an assembly of the small projections 48b separated from one another by the lattice-like insulating film 44z is formed on the electrode pad 46b on the scribe area 40b (FIG. 17C). The semiconductor wafer 40 is then immersed in the electroless Au plating solution and zincated. Thus, the Au film 49b is formed on the surfaces of the projecting electrodes 48 on the semiconductor chip area 40a and on the assembly of the small projections 48b on the scribe area (FIG. 17D).

Figure 17E:
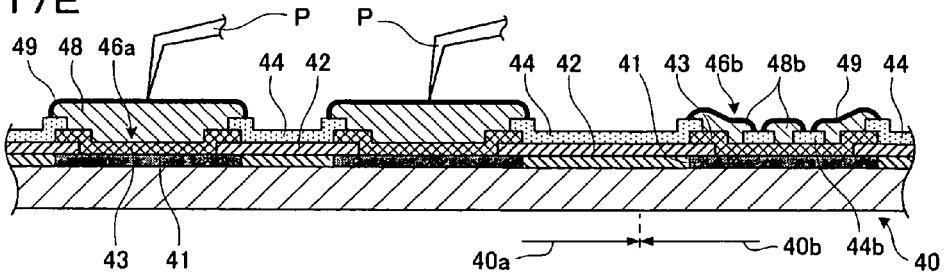
Figure 17F:
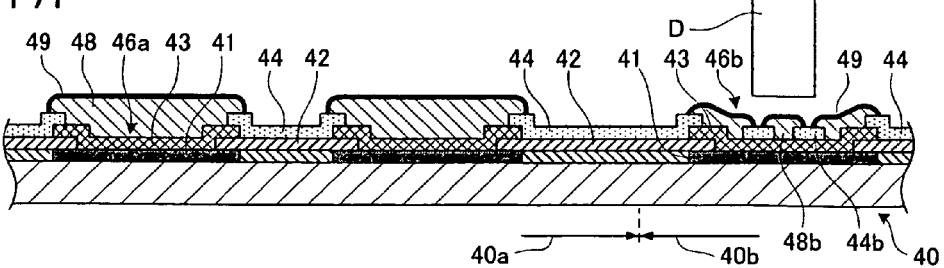

The probes P are subsequently applied to the projecting electrodes 48 with the Au films 49a in the semiconductor chip area 40a to inspect the semiconductor elements for electrical properties (FIG. 17E). After the inspections are finished, the wafer is diced at the scribe area 40b using the dicing blade D to divide the wafer into semiconductor chips corresponding to the semiconductor chip areas 40a (FIG. 17F).

Thus, the projecting electrodes 48 with the Au films 49 are formed only on the electrode pads 46a in the semiconductor chip area 40a of the semiconductor wafer 40 by electroless plating. Consequently, the individual semiconductor chips with the projecting electrodes 48 can be obtained.

Thus, the present method can also exert effects similar to the effects (1), (2), and (3) described for the semiconductor wafer shown in FIG. 2.

The electrode pad 46b already used for the inspection is plated simultaneously with the formation of the projecting electrodes 48. However, this results in the assembly of the small projections 48b separated from one another by the lattice-like insulating film 44b. Consequently, stress is unlikely to occur during dicing, allowing the inhibition of possible chipping or cracking.

Figure 18A:
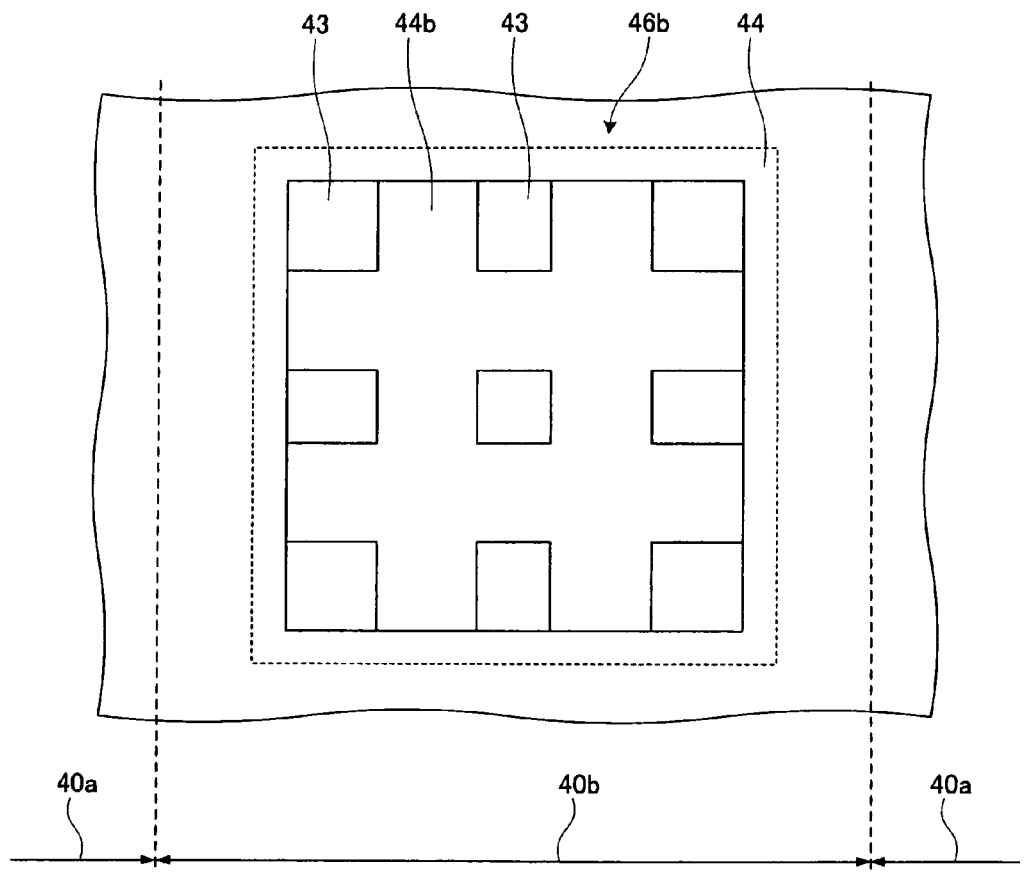
FIGS. 18A and 18B are a plan view and a sectional view showing that the semiconductor wafer in accordance with Embodiment 4 is being manufactured.
Figure 18B:
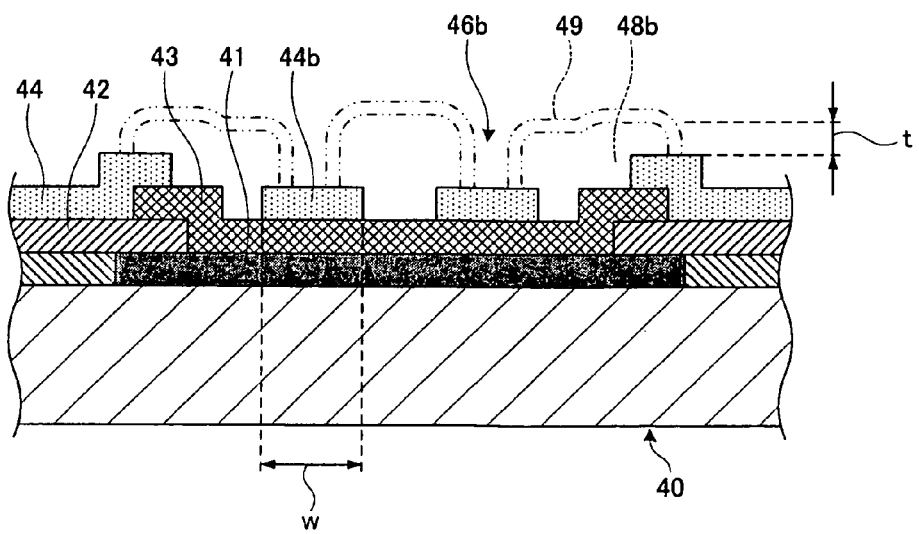

FIGS. 18A and 18B show the lattice-like insulating film 44b. The insulating film 44b is desirably formed to have a width W greater than 2t when the thickness of each of the small projections 48b (and projecting electrodes 48) is defined as t. This is because the growth of plating in the electroless plating method is isotropic, so that the lattice-like insulating film 44b, having the width W, prevents the possible contact between the adjacent small projections 48b grown from the metal exposed portions (Al layer 43) partitioned by the insulating film 44b. Thus, possible defects during dicing can be inhibited.

The lattice-like insulating film 44b is advantageously formed simultaneously with the formation of the insulating film 44 using the same material as that of the insulating film 44, as described above. However, the present invention is not limited to this. The lattice-like insulating film 44b may be formed only on the Al layer 43 in the scribe area 40b after the formation of the insulating film 44, that is, in a step different from that of forming the insulating film 44.

As described above, during the manufacture of the semiconductor wafer in accordance with the present invention, the insulating film covering the electrode portion is formed only in the scribe area, or the electrode portion in the semiconductor chip area and the electrode portion in the scribe area include the different surface metals, or the lattice-like insulator is provided in the electrode portion in the scribe area. This enables the projecting electrodes to be formed only on the electrode portions in the semiconductor chip area without using any mask, utilizing the advantages of electroless plating. The methods shown in FIGS. 15 to 18 plate the electrode portion in the scribe area but only form the assembly of the small projections.

Thus, for the semiconductor chip area, the presence of the projecting electrodes enables the inhibition of possible damage to the electrode portions and the underlying interlayer insulating film, wiring layer, and active elements during probing or bonding as well as a possible variation in properties resulting from the damage. Property evaluations in the semiconductor manufacturing process can be carried out using the electrode portions and monitor elements in the scribe area. When the wafer is divided into individual semiconductor chips, dicing is carried out on the scribe area in which no projecting electrode has been formed or in which only the assembly of the small projections has been formed. This makes it possible to inhibit possible chipping or cracking. Thus, even highly miniaturized and integrated semiconductor chips can be reliably manufactured at a high yield. This enables a reduction in manufacturing costs and lead time.

What is claimed is:
1. A semiconductor chip comprising:
a substrate;
semiconductor elements formed on the substrate;
first electrode pads electrically connected to the respective semiconductor elements;
a first insulating film over the semiconductor elements, wherein the first insulating film includes first openings therein at locations of the first electrode pads; and
second electrode pads coplanar with the first electrode pads,
wherein the first insulating film is in direct contact with at least a part of each of the second electrode pads,
wherein the first insulating film further includes second openings therein at locations of the second electrode pads, and wherein a side surface of at least one of the second electrode pads is exposed below the first insulating film.

2. The semiconductor chip according to claim 1, further comprising projecting electrodes on only the first electrode pads, wherein the projecting electrodes directly contact the first electrode pads.

3. The semiconductor chip according to claim 1, wherein the first electrode pads are larger than the second electrode pads.

4. The semiconductor chip according to claim 1, wherein the first electrode pads are arranged in two lines.

5. The semiconductor chip according to claim 1, wherein the first electrode pads are Al.

6. The semiconductor chip according to claim 1, wherein the second electrode pads are Al.

7. The semiconductor chip according to claim 1, wherein a top surface of each of the second electrode pads is exposed through the second opening in the first insulating film.

8. The semiconductor chip according to claim 1, wherein a metal layer different from that in a surface layer of each of the first electrode pads is in a surface layer of each of the second electrode pads.

9. The semiconductor chip according to claim 1, wherein a Cu layer is at predetermined first and second electrode pads, and an Al layer is on the Cu layer of only the first electrode pads.

10. The semiconductor chip according to claim 1, wherein a Cu layer is at predetermined first and second electrode pads, and an Al layer is on the Cu layer of only the second electrode pads.

* * * * *